US009847319B2

(12) United States Patent
Song et al.

(10) Patent No.: US 9,847,319 B2
(45) Date of Patent: Dec. 19, 2017

(54) SOLID STATE DRIVE PACKAGE AND DATA STORAGE SYSTEM INCLUDING THE SAME

(71) Applicant: SAMSUNG ELECTRONICS CO., LTD., Suwon-si, Gyeonggi-Do (KR)

(72) Inventors: Sang-Sub Song, Suwon-si (KR); Sung-Wook Hwang, Seongnam-si (KR); Yeoung-Jun Cho, Seoul (KR); Ki-Hong Jeong, Jeonju-si (KR); Tae-Heum Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/147,925

(22) Filed: May 6, 2016

(65) Prior Publication Data
US 2017/0025385 A1    Jan. 26, 2017

(30) Foreign Application Priority Data
Jul. 24, 2015   (KR) .................. 10-2015-0105288

(51) Int. Cl.
*H01L 25/065*   (2006.01)
*H01L 25/00*   (2006.01)
(Continued)

(52) U.S. Cl.
CPC ...... *H01L 25/0657* (2013.01); *H01L 23/3128* (2013.01); *H01L 23/562* (2013.01); *H01L 25/0652* (2013.01); *H01L 25/0655* (2013.01); *H01L 25/105* (2013.01); *H01L 25/16* (2013.01); *H01L 25/18* (2013.01); *H01L 25/50* (2013.01); *H01L 24/13* (2013.01); *H01L 24/16* (2013.01); *H01L 24/17* (2013.01); *H01L 24/32* (2013.01); *H01L 24/48* (2013.01); *H01L 24/73* (2013.01); *H01L 2224/13025* (2013.01); *H01L 2224/16146* (2013.01); *H01L 2224/16227* (2013.01); *H01L 2224/17181* (2013.01); *H01L 2224/32145* (2013.01); *H01L 2224/32225* (2013.01);
(Continued)

(58) Field of Classification Search
CPC ... H01L 25/0657; H01L 25/162; H01L 25/50; H01L 23/3114; H01L 24/46
See application file for complete search history.

(56) References Cited

U.S. PATENT DOCUMENTS 7,087,989 B2 *  8/2006  Nakayama .......... H01L 23/3114
                                                  257/686
7,354,800 B2    4/2008  Carson
(Continued)

FOREIGN PATENT DOCUMENTS

KR   10-2014-0117135    7/2014

*Primary Examiner* — Peniel M Gumedzoe
(74) *Attorney, Agent, or Firm* — Volentine & Whitt, PLLC

(57) ABSTRACT

A solid state drive (SSD) package type has a lower package including a lower package substrate, a controller chip mounted on the lower package substrate, and a plurality of upper packages disposed on the lower package as spaced apart from each other. The plurality of upper packages includes at least one non-volatile memory and at least one first individual electronic component. The upper packages are electrically connected to the lower package such that the package type is a package-on-package (PoP) type. The height of the first individual electronic component is greater than the spacing between the lower package and each of the upper packages.

20 Claims, 37 Drawing Sheets

(51) Int. Cl.
*H01L 23/31* (2006.01)
*H01L 25/16* (2006.01)
*H01L 23/00* (2006.01)
*H01L 25/10* (2006.01)
*H01L 25/18* (2006.01)

(52) U.S. Cl.
CPC ............. *H01L 2224/48091* (2013.01); *H01L 2224/48145* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01); *H01L 2225/06586* (2013.01); *H01L 2225/06589* (2013.01); *H01L 2225/1023* (2013.01); *H01L 2225/1058* (2013.01); *H01L 2225/1082* (2013.01); *H01L 2225/1088* (2013.01); *H01L 2225/1094* (2013.01); *H01L 2924/15311* (2013.01); *H01L 2924/15313* (2013.01); *H01L 2924/15331* (2013.01); *H01L 2924/1815* (2013.01); *H01L 2924/19041* (2013.01); *H01L 2924/19043* (2013.01); *H01L 2924/19105* (2013.01); *H01L 2924/3511* (2013.01)

(56) References Cited

U.S. PATENT DOCUMENTS

| | | | |
|---|---|---|---|
| 7,851,900 | B2 | 12/2010 | Ohsaka et al. |
| 8,838,885 | B2 | 9/2014 | Kwak et al. |
| 8,897,051 | B2 | 11/2014 | Itakura et al. |
| 2004/0195668 | A1* | 10/2004 | Sawamoto .......... H01L 23/3114 257/686 |
| 2004/0222534 | A1* | 11/2004 | Sawamoto ............. H01L 21/56 257/778 |
| 2008/0251913 | A1 | 10/2008 | Inomata |
| 2009/0206455 | A1* | 8/2009 | Harper ................ H01L 23/3128 257/659 |
| 2012/0317332 | A1* | 12/2012 | Kwak ................. G06F 12/0246 711/102 |
| 2013/0049227 | A1* | 2/2013 | Kim .................... H01L 23/3128 257/777 |
| 2014/0097513 | A1 | 4/2014 | Lee |
| 2014/0151880 | A1 | 6/2014 | Kao et al. |
| 2014/0291868 | A1 | 10/2014 | Lee et al. |
| 2016/0111396 | A1* | 4/2016 | Kim ................. H01L 23/49838 257/686 |

* cited by examiner

US 9,847,319 B2

SOLID STATE DRIVE PACKAGE AND DATA STORAGE SYSTEM INCLUDING THE SAME

PRIORITY STATEMENT

This application claims the benefit of Korean Patent Application No. 10-2015-0105288, filed on Jul. 24, 2015, in the Korean Intellectual Property Office, the disclosure of which is hereby incorporated by reference in its entirety.

BACKGROUND

The inventive concept relates to a solid state drive (SSD) package and a data storage system including the SSD package. More particularly, the inventive concept relates to an SSD package of a package-on-package (PoP) type and a data storage system including the SSD package.

SSDs have been considered as next-generation storage devices and in particular as a substitute for conventional hard disk drives. An SSD is a storage device based on a non-volatile memory, and thus, has a low power consumption and high storage capacity. In addition, when an SSD is used as a storage device of a computer system, the computer system may be configured to boot fast. Also, although current data storage systems employing SSDs have high operating speeds, demands for increased speeds of data storage system are only expected to increase. In addition, there are demands for computer systems or data storage systems that are even more compact (i.e., miniaturized) and lightweight than those that are currently available.

SUMMARY

According to an aspect of the inventive concept, there is provided a solid state drive (SSD) package-on-package (PoP) including a lower package comprising a lower package substrate, a controller chip disposed on and mounted to the lower package substrate, and a lower mold layer on an upper surface of the lower package substrate and covering the controller chip, and a plurality of upper packages disposed on the lower package as spaced laterally apart from each other, and including a non-volatile memory package and an individual component package. The non-volatile memory package comprises a non-volatile memory and the individual component package comprises an individual electronic component. The non-volatile memory and the individual electronic component being electrically connected to the lower package. Furthermore, the height of the first individual electronic component is greater than a thickness of the lower mold layer at the controller chip as measured from the upper surface of the lower package substrate.

According to another aspect of the inventive concept, there is provided a solid state drive (SSD) package-on-package (PoP) including a lower package comprising a lower package substrate, and a semiconductor memory chip and a controller chip mounted to the lower package substrate, and a plurality of upper packages disposed on the lower package as spaced laterally apart from each other and electrically connected to the lower package. The lower package substrate has first and second sides that face in directions opposite to each other. The semiconductor memory chip and the controller chip are disposed on the lower package substrate respectively adjacent the first side and the second side of the lower package substrate as viewed in plan. The plurality of upper packages includes a first upper package comprising a non-volatile semiconductor memory chip and a second upper package comprising a first individual electronic component. The first and second upper packages are disposed adjacent the first side and the second side of the lower package substrate, respectively, as viewed in plan.

According to still another aspect of the inventive concept, there is provided a solid state drive (SSD) package-on-package (PoP) including a lower package comprising a lower package substrate and a controller chip disposed on an upper surface of and mounted to the lower package substrate, and a plurality of non-volatile memory packages disposed on and mounted to the lower package as spaced apart from each other and electrically connected to the lower package, and comprising a stack of non-volatile semiconductor memory chips.

According to another aspect of the inventive concept, there is provided a data storage system including solid state drive (SSD) package comprising a lower package comprising a lower package substrate, a controller chip mounted on the lower package substrate, and a lower mold layer formed on an upper surface of the lower package substrate to cover the controller chip, a plurality of upper packages disposed on the lower package to be spaced apart from each other and to be connected to the lower package in a package-on-package (PoP) type and comprising upper package substrates and a plurality of non-volatile memory semiconductor chips mounted on the upper package substrates, a main board on which the SSD package is mounted, and at least one first individual electronic component mounted on the main board as spaced apart from the SSD package, and used to drive the SSD package. Each individual electronic component has a thickness that is greater than a thickness of the lower mold layer.

According to still another aspect of the inventive concept, there is provided a solid state drive (SSD) package-on-package (PoP) including a lower package comprising a lower package substrate, and a controller chip disposed on an upper surface of and mounted to the lower package substrate, and a plurality of upper packages disposed on and mounted to the lower package as spaced laterally apart from each other. Each of the upper packages are electrically connected to the lower package, each of the upper packages includes an upper package substrate, and the plurality of upper packages include an individual electronic component and at least one semiconductor memory chip comprising a non-volatile memory spaced laterally from the individual electronic component. The electronic component and each said semiconductor memory chip are disposed on an upper surface of and mounted to a respective one of the upper package substrates. The upper package substrates have respective lower surfaces facing the lower package, and the height of the individual electronic component is greater than each of the respective distances between the upper surface of the lower package substrate and the lower surfaces of the upper package substrates.

BRIEF DESCRIPTION OF THE DRAWINGS

Examples of the inventive concept will be more clearly understood from the following detailed description taken in conjunction with the accompanying drawings in which.

DETAILED DESCRIPTION

Figure 1:
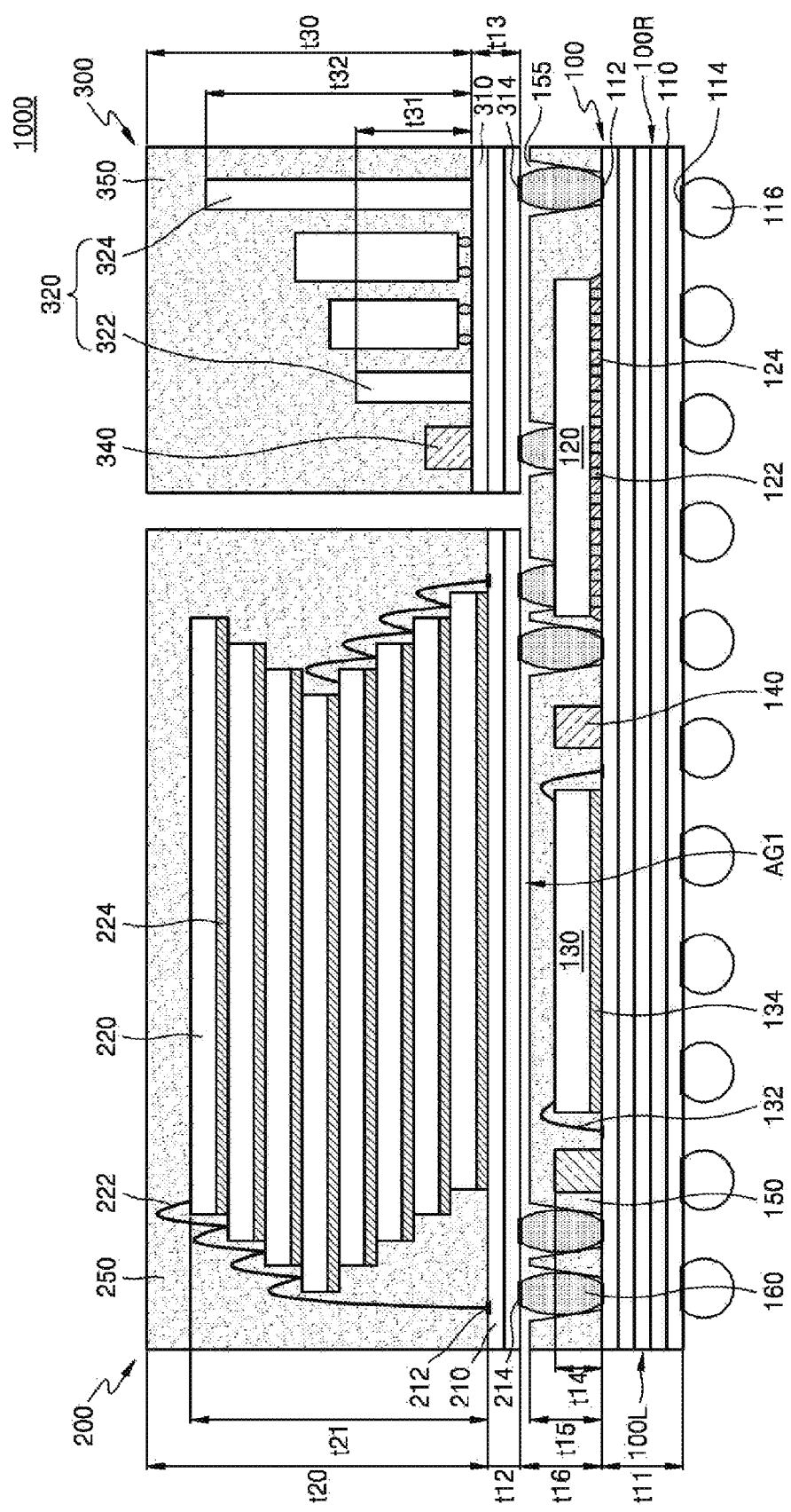
FIG. 1 is a cross-sectional view of an example of a solid state drive (SSD) package-on-package (which may be referred to hereinafter simply as a package) according to the inventive concept.

The attached drawings of various examples of devices and systems, etc. are offered to allow for a sufficient understanding, merits thereof, and objectives of the inventive concept. This inventive concept may, however, be exemplified in many different forms and should not be construed as limited to the examples set forth herein. Rather, these examples are provided so that this disclosure will be thorough and complete, and will fully convey the scope of the inventive concept to one of ordinary skill in the art. Sizes of components in the drawings may be exaggerated for convenience of explanation. In other words, since sizes and thicknesses of components in the drawings are arbitrarily illustrated for convenience of explanation, the following examples are not limited thereto. Also, like reference numerals are used to designate like elements and features throughout the drawings. Therefore, elements and features of particular examples which are designated by the same reference numerals and once described. More specifically in connection with a first one of the examples are not described again. More specifically with the other examples for the sake of brevity.

It will be understood that when an element, such as a layer, a region, or a substrate, is referred to as being "on" "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. In the drawings, the dimensions of structures are exaggerated for convenience and clarity of the description, and parts having no relation to the description are omitted.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. For example, in the case of electronic components the term "thickness" may be used synonymously with what would be understood to be the height of the component. In the case of a layer, the term "thickness" will be understood to refer to the thickness at some intermediate region of the layer, i.e., a representative thickness of the layer as opposed to some thickness at an edge region of the layer. The term "adjacent" will be understood as being used synonymously with the terms "proximate" or "at". Relative terms "upper" or "lower" as used to describe surfaces of a particular element or feature may refer to the uppermost or lowermost surface of that particular element or feature. The term "connected" will be understood as referring to an electrical connection as the context will make clear. The term "package-on-package" or PoP will be understood as an integral device including one discrete bottom package comprising a chip and at least one upper discrete package disposed on and integral with the bottom package and comprising a chip. The term "chip" in turn is used herein to denote an integrated circuit (IC), as distinguished from the term "individual electronic component". That is the term "individual electronic component" denotes any independent electronic component which has an intrinsic function as distinguished from an IC.

Hereinafter, examples of the inventive concept will be described. More specifically with reference to the attached drawings. As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a solid state drive (SSD) package 1000 according to the inventive concept.

Referring to FIG. 1, the SSD package 1000 includes a lower package 100 and upper packages 200 and 300 disposed on the lower package 100 so as to be connected to the lower package 100 in a package-on-package (PoP) type.

The lower package 100 may include a lower package substrate 110 and a controller chip 120 mounted on the lower package substrate 110.

The lower package substrate 110 may be, for example, a printed circuit board. When the lower package substrate 110 is a printed circuit board, the lower package substrate 110 may include a substrate base, and an upper pad 112 and a lower pad 114 respectively formed on upper and lower surfaces of the substrate base. The upper pad 112 and the lower pad 114 may be respectively exposed by solder resist layers covering the upper and lower surfaces of the substrate base. The substrate base may include at least one material selected from a phenol resin, an epoxy resin, and polyimide. For example, the substrate base may include at least one material selected from a frame retardant 4 (FR4), tetrafunctional epoxy, polyphenylene ether, epoxy/polyphenylene oxide, bismaleimide triazine (BT), thermount, cyanate ester, polyimide, and liquid crystal polymer. The upper pad 112 and the lower pad 114 may include copper, nickel, stainless steel, or beryllium copper. Internal wires for electrically connecting the upper pad 112 and the lower pad 114 to each other may extend within the substrate base. The upper pad 112 and the lower pad 114 may be some parts exposed by the solder resist layers in circuit wires that are patterned after coating the upper and lower surfaces of the substrate base with a Cu foil. The substrate base may include a plurality of base layers, and the lower package substrate 110 may have layers formed to have circuit wires on the upper and lower surfaces of the substrate base, and between the plurality of base layers. That is, the lower package substrate 110 may include a plurality of layers.

The controller chip 120 may be mounted on the lower package substrate 110. The controller chip 120 may provide a flash interface for a non-volatile memory semiconductor chip 220. The controller chip 120 may provide the interface and a protocol between a host and the non-volatile memory semiconductor chip 220. The controller chip 120 may provide a standard protocol such as PCI Express (PCIe), SA-SCSI (SAS), or Serial ATA (SATA), of an interface for the non-volatile memory semiconductor chip 220 and the host. In addition, the controller chip 120 may perform wear levelling, garbage collection, bad block management, and error correcting code (ECC) on the non-volatile memory semiconductor chip 220.

The controller chip 120 may be electrically connected to the lower package substrate 110 via first connection bumps 122. Selectively, an underfill material layer 124 surrounding the first connection bumps 122 may be disposed between the controller chip 120 and the lower package substrate 110.

The lower package 100 may further include a memory semiconductor chip 130 mounted on the lower package substrate 110. The memory semiconductor chip 130 may be mounted on the lower package substrate 110 and separate from the controller chip 120. The memory semiconductor chip 130 may be, for example, a non-volatile memory semiconductor chip such as dynamic random access memory (DRAM). The memory semiconductor chip 130 may scale access-time and data-transfer performance to be suitable for processing performance of a system including the SSD package 1000, by providing a cache. The memory semiconductor chip 130 may be electrically connected to the lower package substrate 110 via lower bonding wires 132. The memory semiconductor chip 130 may be attached to the lower package substrate 110 by a lower die attach film (DAF) 134. If the controller chip 120 has a cache function, the memory semiconductor chip 130 may be omitted.

In FIG. 1, an active surface of the controller chip 120 faces the lower package substrate 110, and the controller chip 120 is electrically connected to the lower package substrate 110 as a flip chip. In addition, an inactive surface of the memory semiconductor chip 130 faces the lower package substrate 110, and the memory semiconductor chip 130 is electrically connected to the lower package substrate 110 via the lower bonding wires 132. The above examples show the manner in which the controller chip 120 and/or the memory semiconductor chip 130 is electrically connected to the lower package substrate 110 in FIG. 1. However, the inventive concept is not limited thereto.

In the present specification, a chip or a semiconductor chip, unless otherwise specified, denotes a chip obtained by dicing a semiconductor wafer including integrated circuits manufactured by semiconductor processes. The semiconductor wafer may include silicon (Si). Alternatively, the semiconductor wafer may include a semiconductor element such as germanium (Ge), or a compound semiconductor such as silicon carbide (SiC), gallium arsenide (GaAs), indium arsenide (InAs), or indium phosphide (InP).

The lower package 100 may further include a first individual electronic component 140 mounted on the lower package substrate 110. The first individual electronic component 140 may include a passive device such as a chip resistor, a chip capacitor, or a multi-layer ceramic capacitor (MLCC).

In the present specification, the term "individual electronic component" does not refer to a part of an integrated circuit, but refers to a discrete electronic component that performs an independent function(s) and can be independently mounted in an electronic device. An individual electronic component may thus be an active device or a passive device such as a resistor, a capacitor, an inductor, a switch, a sensor, a DC-DC converter, quartz for generating clock signals, or a voltage regulator. In addition, in the present specification, the term "individual electronic component" may refer to an electronic component that is an active device or a passive device used to drive an SDD package. For example, an individual electronic component may refer to an active device or a passive device used to drive the controller chip 120, the memory semiconductor chip 130, and/or the non-volatile memory semiconductor chip 220.

In the drawings of the present specification, pads of a package substrate (e.g., the lower package substrate 110) for electrically connecting the individual electronic component (e.g., the controller chip 120 and the first individual electronic component 140) to the package substrate are omitted for ease of illustration, but the controller chip 120 and the first individual electronic component 140 may be electrically connected to the lower package substrate 110 via pads similar to the upper pads 112. Likewise, some pads of the upper package substrates 210 and 310 may be omitted for ease of illustration.

A lower mold layer 150 may be formed on the upper surface of the lower package substrate 110. The lower mold layer 150 may be formed on the upper surface of the lower package substrate 110 and cover the controller chip 120, the memory semiconductor chip 130, and/or the first individual electronic component 140. The lower mold layer 150 may include a resin, for example, an epoxy mold compound (EMC).

The lower mold layer 150 may include through holes 155 exposing some parts of the upper surface of the lower package substrate 110. The upper pads 112 of the lower package substrate 110 may be exposed by the through holes 155. The upper packages 200 and 300 may be electrically connected to the lower package 100 via conductive connection members 160 that are disposed in the through holes 155 to be connected to some parts of the upper surface of the lower package substrate 110, which are exposed by the through holes 155. The conductive connection members 160 may be, for example, solder balls or bumps. A lower end of the conductive connection member 160 may be connected to the upper pad 112 of the lower package substrate 110, and an upper end of the conductive connection member 160 may be connected to a lower pad 214 or 314 of the upper package substrate 210 or 310. A thickness t16 of the conductive connection member 160 may be greater than a thickness t15 of the lower mold layer 150.

Unless otherwise specified, the thickness of a component refers to the dimension of the component from a lowermost end to an uppermost end of the component in the figures.

The upper packages 200 and 300 will be referred to hereinafter as a first upper package 200 and a second upper package 300. The first and second upper packages 200 and 300 may be electrically connected to the lower package 100 via the conductive connection members 160 in a PoP manner. The first and second upper packages 200 and 300 may be disposed on the lower package 100 as spaced apart from each other.

The first and second upper packages 200 and 300 may respectively include a first upper package substrate 210 and a second upper package substrate 310. The first and second upper package substrates 210 and 310 may be, for example, printed circuit boards. When the first and second upper package substrates 210 and 310 are printed circuit boards, the first and second upper package substrates 210 and 310 may respectively include substrate bases, and upper pads 212 and lower pads 214 and 314 formed on upper and lower surfaces of the substrate bases. The substrate base may include a plurality of base layers, and the first and second upper package substrates 210 and 310 may respectively include layers formed on the upper and lower substrates of the substrate bases, and between every pair of the base layers. That is, the first and second upper package substrates 210 and 310 may include a plurality of layers, respectively. The first and second upper substrates 210 and 310 are also otherwise basically similar to the lower package substrate 110 and thus, further detailed descriptions of the first and second upper package substrates 210 and 310 will be omitted.

The first upper package 200 may include a non-volatile memory semiconductor chip 220 mounted on the first upper package substrate 210. The non-volatile memory semiconductor chip 220 may be, for example, a NAND flash memory, resistive random access memory (RRAM), magnetoresistive RAM (MRAM), phase-change RAM (PRAM), or ferroelectric RAM (FRAM). Therefore, the first upper package 200 may be referred to as a non-volatile memory package 200.

The non-volatile memory package 200 may include a plurality of non-volatile memory semiconductor chips 220 stacked on the first upper package substrate 210. The plurality of non-volatile memory semiconductor chips 220 may be stacked on the first upper package substrate 210 by an upper DAF 224 to be stepped. The plurality of non-volatile memory semiconductor chips 220 may be electrically connected to the first upper package substrate 210 via upper bonding wires 222. The non-volatile memory package 200 may further include a first upper mold layer 250 formed on the upper surface of the first upper package substrate 210. The first upper mold layer 250 may be formed on the upper surface of the first upper package substrate 210 and cover the non-volatile memory semiconductor chip 220.

The second upper package 300 may include a second individual electronic component 320 attached to the second upper package substrate 310. The second individual electronic component 320 may be, for example, an active device or a passive device such as a resistor, a capacitor, an inductor, a switch, a sensor, a DC-DC converter, quartz for generating clock signals, or a voltage regulator. Therefore, the second upper package 300 may be referred to as an individual electronic component package 300. The second individual electronic component 320 may be electrically connected to the second upper package substrate 310. Depending on the type of second individual electronic component 320, the second individual electronic component 320 may be electrically connected to the second upper package substrate 310 in any one of various manners. Because it will be readily apparent to those of ordinary skill in the art as to how the second individual electronic component 320 may be electrically connected to the second upper package substrate 310 via pads formed on the upper surface of the second upper package substrate 310, detailed descriptions about these connections will be omitted.

The individual electronic component package 300 may further include a second upper mold layer 350 formed on an upper surface of the second upper package substrate 310. The second upper mold layer 350 may be formed on an upper surface of the second upper package substrate 310 and cover the second individual electronic component 320.

The second upper package 300, that is, the individual electronic component package 300, may need more circuit wires than the first upper package 200, that is, the non-volatile memory package 200. Therefore, the second upper package substrate 310 may have more layers than the first upper package substrate 210. Also, because the lower package 100 includes the controller chip 120, the lower package substrate 110 may need more circuit wires than the first and second upper package substrates 210 and 310. Therefore, the second upper package substrate 310 may have fewer layers than the lower package substrate 110 and more layers than the first upper package substrate 210.

For example, the lower package substrate 110 may have six layers, the first upper package substrate 210 may have three layers, and the second upper package substrate 310 may have four layers, but the inventive concept is not limited to these specific numbers of layers for the substrates of the packages.

An upper surface of the lower mold layer 150 may be located at a lower level than lower surfaces of the upper package substrates 210 and 310. Therefore, an air gap AG1 may be formed between the upper surface of the lower mold layer 150 and the lower surfaces of the upper package substrates 210 and 310.

The lower surfaces of the first and second upper package substrates 210 and 310 may be located at the same level as the lower package substrate 110. Also, the conductive connection members 160 connecting the first upper package substrate 210 and the lower package substrate 110 to each other and the conductive connection members 160 connecting the second upper package substrate 220 and the lower package substrate 110 to each other may have the same thickness t16.

The memory semiconductor chip 130 and the controller chip 120 may be respectively mounted to be adjacent to a first edge 100L and a second edge 100R, that are opposite to each other, of the lower package 100. The non-volatile memory package 200 and the individual electronic component package 300 may be disposed on the lower package 100 so as to be adjacent to the first edge 100L and the second edge 100R. The non-volatile memory package 200 may span the memory semiconductor chip 130 of the lower package 100. The individual electronic component package 300 may span at least a part of the controller chip 120 of the lower package 100, i.e., may overlap the controller chip 120.

The lower package substrate 110 may have more layers than the upper package substrates 210 and 310. The plurality of base layers of the lower package substrate 110 and the upper package substrates 210 and 310 may have thicknesses that are similar to each other. Therefore, a thickness t11 of the lower package substrate 110 may be greater than thicknesses t12 and t13 of the first and second upper package substrates 210 and 310. In addition, the thickness t12 of the first upper package substrate 210 may be less than the thickness t13 of the second upper package substrate 310.

A thickness t14 of the first individual electronic component 140 may be less than the thickness t15 of the lower mold layer 150. Therefore, the first individual electronic component 140 may be covered by the lower mold layer 150. Although not shown in the drawings, the thickness t14 of the first individual electronic component 140 may be equal to or greater than the thickness t15 of the lower mold layer 150, and may be less than a distance between the upper surface of the lower package substrate 110 and the lower surfaces of the first and second upper package substrates 210 and 310. The distance between the upper surface of the lower package substrate 110 and the lower surfaces of the first and second upper package substrates 210 and 310 may be substantially equal to the thickness t16 of the conductive connection member 160. Therefore, the thickness t14 of the first individual electronic component 140 may be equal to or greater than the thickness t15 of the lower mold layer 150, and may be less than the thickness t16 of the conductive connection member 160. In this case, an upper part of the first individual electronic component 140 may not be covered by the lower mold layer 150, and the first individual electronic component 140 may be spaced apart from the lower surfaces of the first and second upper package substrates 210 and 310.

A thickness t12+t20 of the first upper package 200 may be equal to a thickness t13+t30 of the second upper package 300, but the inventive concept is not limited thereto. A thickness t20 of a first upper mold layer 250 may be equal to a thickness t30 of the second upper mold layer 350, but the inventive concept is not limited thereto. For example, when the thickness t12 of the first upper package substrate 210 is less than the thickness t13 of the second upper package substrate 310, the thickness t20 of the first upper mold layer 250 may be greater than the thickness t30 of the second upper mold layer 350 so that the total thickness t12+t20 of the first upper package 200 may be equal to the total thickness t13+t30 of the second upper package 300. Otherwise, the thickness t20 of the first upper mold layer 250 may be equal to the thickness t30 of the second upper mold layer 350, so that the total thickness t12+t20 of the first upper package 200 may be less than the total thickness t13+t30 of the second upper package 300.

A thickness t11+t15 of the lower package 100 may be less than the thickness t12+t20 of the first upper package 200 and the thickness t13+t30 of the second upper package 300. In addition, the thickness t15 of the lower mold layer 150 may be less than the thickness t20 of the first upper mold layer 200 and the thickness t30 of the second upper mold layer 300.

A total thickness t21 of the plurality of non-volatile memory semiconductor chips 220 that are stacked may be less than the thickness t20 of the first upper mold layer 250. Therefore, the plurality of non-volatile memory semiconductor chips 220 may be embedded in the first upper mold layer 250.

The individual electronic component package 300 may include a plurality of second individual electronic components 320. The plurality of second electronic components 320 may include a first component 322 and a second component 324. The first component 322 and the second component 324 of the individual electronic component package 300 may have different thicknesses t31 and t32 from each other. The thickness t31 of the first component 322, namely the smallest thickness among those of the plurality of second individual electronic components 320 in this example, may be greater than the thickness t15 of the lower mold layer 150. The thickness t31 of the first component 322, i.e., again, the smallest of the thicknesses of the individual electronic components 320 in this example, may be equal to or greater than the thickness t16 of the conductive connection member 160.

That is, in this example of an SSD package 1000 according to the inventive concept, those individual electronic components having relatively large thicknesses, namely, the plurality of second individual electronic components 320, are not mounted directly on the substrate of the lower package 100, i.e., are not part of the lowermost package. Thus, the SSD package 1000 may be relatively thin.

The thickness t32 of the second component 324 among the plurality of plurality of second individual electronic components 320 may be less than the thickness t20 of the first upper mold layer 250. Alternatively, the thickness t32 of the second component 324 may be less than the total thickness t21 of the plurality of non-volatile memory semiconductor chips 220 that are stacked. Therefore, since the total thickness t13+t30 of the individual electronic component package 300 in this example is not to greater than the total thickness t12+t20 of the non-volatile memory package 200, the total thickness of the SSD package 1000 may be kept to a minimum.

In some examples, the individual electronic component package 300 further includes a third individual electronic component 340. The third individual electronic component 340 may be a passive device, for example, a chip resistor, a chip capacitor, or an MLCC. A thickness of the third individual electronic component 340 may be similar to that of the first individual electronic component 140. For example, the thickness of the third individual electronic component 340 may be less than the thickness t15 of the lower mold layer 150. In FIG. 1, the individual electronic component package 300 includes the third individual electronic component 340 having a thickness less than the thickness t15 of the lower mold layer 150, but the inventive concept is not limited thereto. For example, the individual electronic component package 300 may only include the second individual electronic component 320 having a relatively greater thickness, and may not include the third individual electronic component 340.

The SSD package 1000 may further include external connection members 116 attached to the lower surface of the lower package substrate 110. The external connection members 116 may be, for example, solder balls. The SSD package 1000 may be electrically connected to an external host or an external system via the external connection members 116.

In the present specification, although FIG. 1 is a cross-sectional view of various elements in the same (vertical) plane, the inventive concept is not limited these elements all lying within the same (vertical) plane. For example, the first individual electronic component 140, some of the conductive connection members 160, and/or all or part of the second individual electronic component 320 may be located in a different (vertical) plane or planes from a vertical plane in which the controller chip 120, the memory semiconductor chip 130, and the non-volatile memory semiconductor chip 220 lie.

Figure 2:
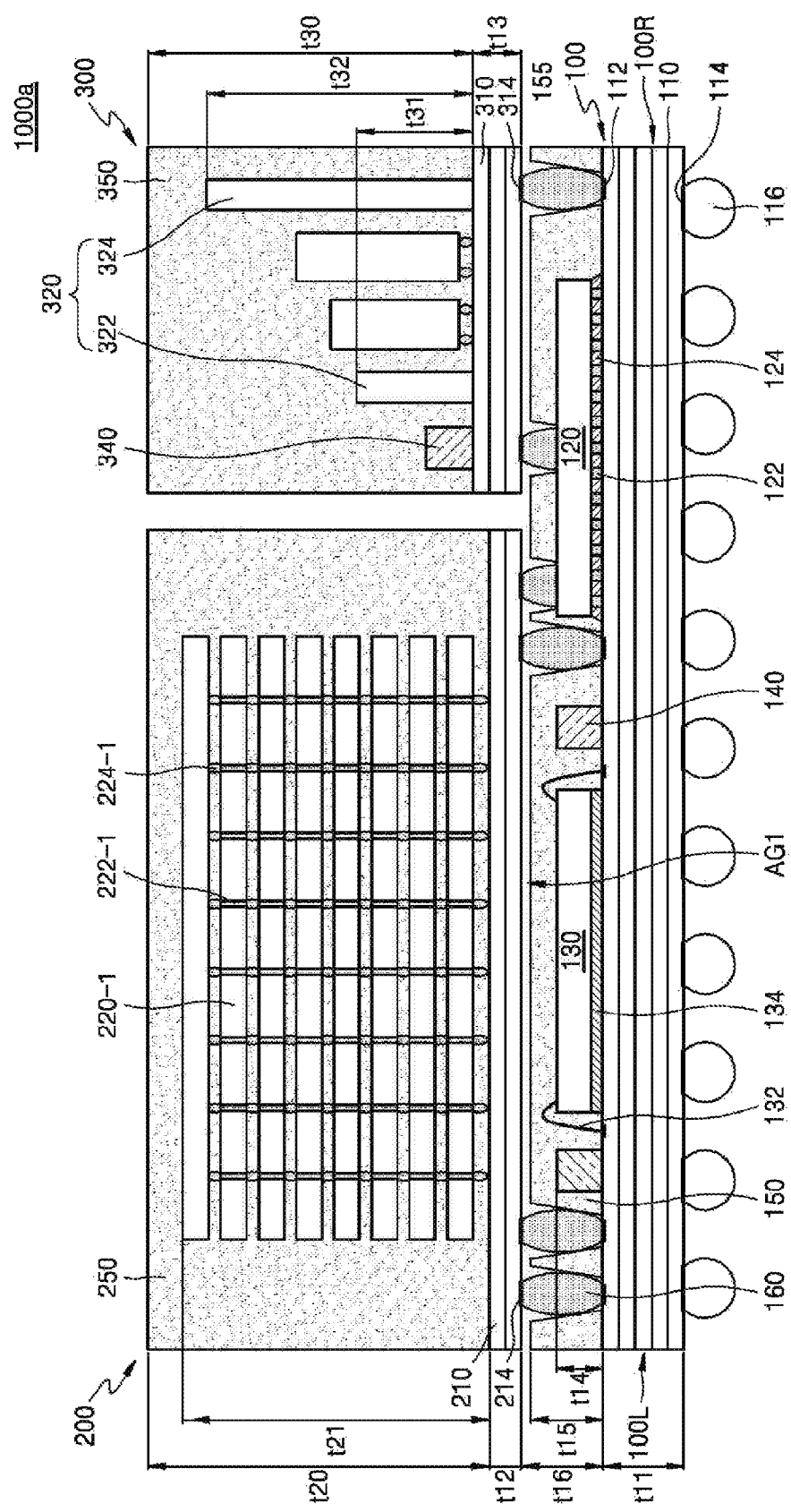
FIG. 2 is a cross-sectional view of an example of an SSD package according to the inventive concept.

FIG. 2 is a cross-sectional view of another example of an SSD package 1000a according to the inventive concept.

Referring to FIG. 2, the SSD package 1000a may include the lower package 100, and the upper packages 200 and 300 disposed on the lower package 100 to be connected to the lower package 100 in a PoP manner. The upper packages 200 and 300 may include a non-volatile memory package 200 and an individual electronic component package 300, respectively.

As is clear from the use of like reference numerals, the lower package 100 and the individual electronic component package 300 are similar to those of the SDD package 1000 of FIG. 1, and thus, detailed descriptions thereof are omitted.

The non-volatile memory package 200 may include a plurality of non-volatile memory semiconductor chips 220-1 stacked on the first upper package substrate 210. The plurality of non-volatile memory semiconductor chips 220-1 may be stacked on the first upper package substrate 210 as aligned in a vertical direction.

Each of the plurality of non-volatile memory semiconductor chips 220-1 may be electrically connected to the first upper package substrate 210 via a through electrode 222-1 penetrating therethrough and a second connection bump 224-1. The through electrode 222-1 may be a through silicon via (TSV). The through electrode 222-1 may include a wiring metal layer and a barrier metal layer surrounding the wiring metal layer. The wiring metal layer may include Cu or W. For example, the wiring metal layer may include Cu, CuSn, CuMg, CuNi, CuZn, CuPd, CuAu, CuRe, CuW, W, or a W alloy, but is not limited thereto. For example, the wiring metal layer may include one or more metals selected from the group consisting of Al, Au, Be, Bi, Co, Cu, Hf, In, Mn, Mo, Ni, Pb, Pd, Pt, Rh, Re, Ru, Ta, Te, Ti, W, Zn, and Zr. The wiring metal layer may be a stack structures of more than one of the metals selected from the foregoing group. The barrier metal layer may include at least one material selected from the group consisting of W, WN, WC, Ti, TiN, Ta, TaN, Ru, Co, Mn, WN, Ni, and NiB in a single-layered structure or a multi-layered structure. However, the material of the through electrode 222-1 is not limited to the above examples. The barrier metal layer and the wiring metal layer may be formed by a physical vapour deposition (PVD) process or a chemical vapour deposition (CVD) process, but are not limited to being formed by either process. A spacer insulating layer may be disposed between the through electrode 222-1 and a semiconductor substrate forming each of the plurality of non-volatile memory semiconductor chips 220-1. The spacer insulating layer may prevent direct contact between a semiconductor device formed on each of the plurality of non-volatile memory semiconductor chips 220-1 and the through electrode 222-1. The spacer insulating layer may include an oxide layer, a nitride layer, a carbide layer, polymer, or a combination thereof. In some examples, a CVD process may be performed to form the spacer insulating layer. The spacer insulating layer may include a high aspect ratio process (HARP) oxide layer based on $O_3$/tetraethyl ortho-silicate (TEOS) formed by a sub-atmospheric CVD process.

Each through electrode 222-1 may be one of a via-first structure, a via-middle structure, and a via-last structure. For example, each through electrode 222-1 may include a portion extending vertically through the non-volatile memory semiconductor chips 220-1, wiring lines, and vias between wiring lines of vertically adjacent ones of the non-volatile memory semiconductor chips 220-1. Also, in this example the through electrode 222-1 is not formed in the uppermost one of the non-volatile memory semiconductor chips 220-1, but the inventive concept not limited thereto. That is, each through electrode 222-1 may extend vertically through all of the non-volatile memory semiconductor chips 220-1.

Figure 3:
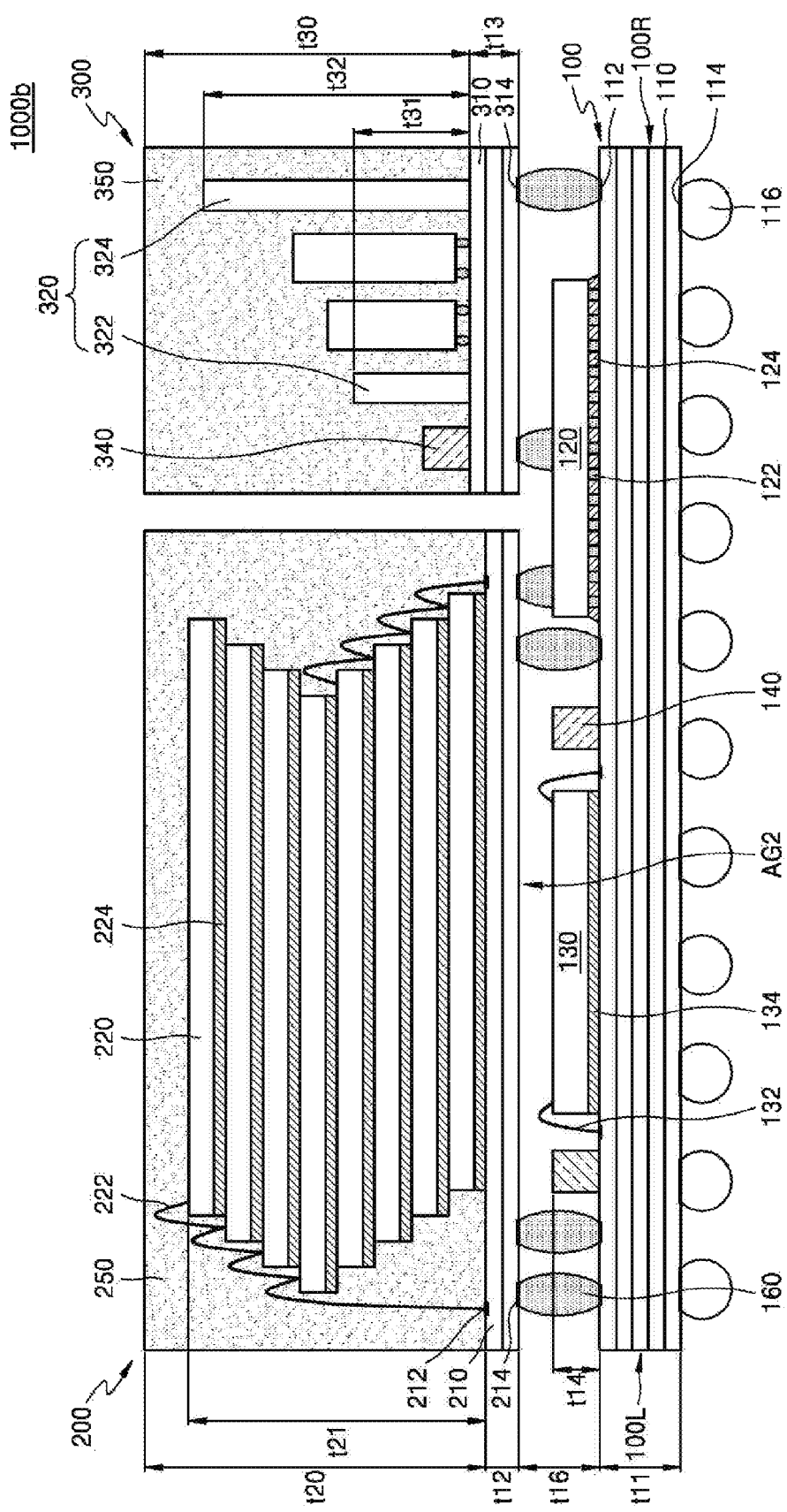
FIG. 3 is a cross-sectional view of an example of an SSD package according to the inventive concept.

FIG. 3 is a cross-sectional view of another example of an SSD package 1000b according to the inventive concept.

Referring to FIG. 3, the SSD package 1000b includes the lower package 100, and the upper packages 200 and 300 disposed on the lower package 100 to be connected to the lower package 100 in a PoP manner. The upper packages 200 and 300 may be a non-volatile memory package 200 and an individual electronic component package 300, respectively.

In the SSD package 1000b of FIG. 3, an air gap AG2 exists between (the upper surface of) the lower package substrate 110 and (the lower surface of) the upper package substrates 210 and 310.

The controller chip 120 and the memory semiconductor chip 130 of the SSD package 1000b of FIG. 3 may be chips that are obtained by dicing a semiconductor wafer, as described above. The diced sections of the semiconductor wafer may then be coated with a mold layer or an encapsulation layer.

Although not shown in FIG. 3, the SSD package 1000b may include the non-volatile memory package 200 of the SSD package 1000a shown in FIG. 2, instead of the non-volatile memory package 200.

Figure 4:
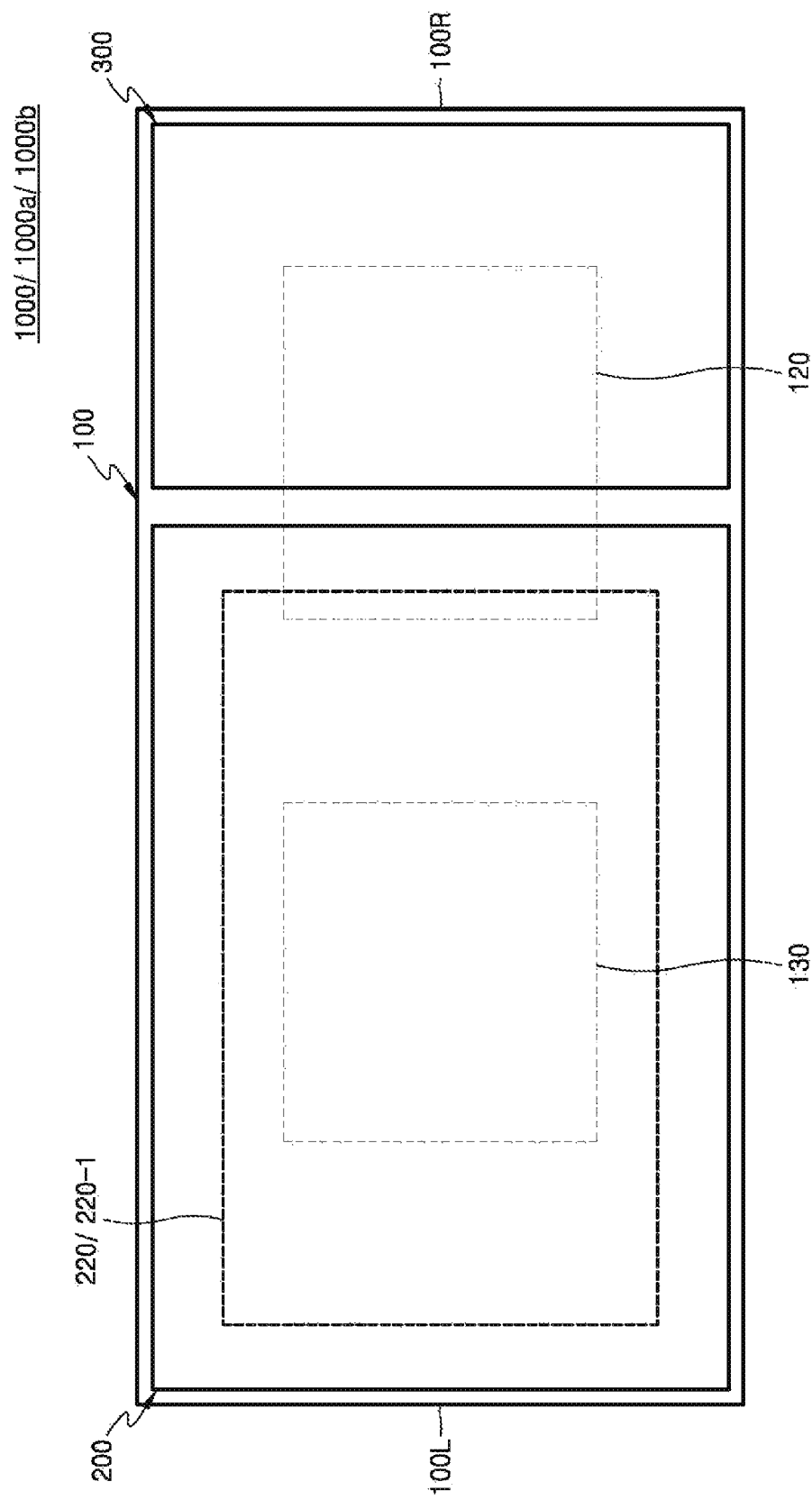
FIG. 4 is a plan view of an arrangement of main elements of an example of an SSD package according to the inventive concept.

FIG. 4 shows an arrangement of main elements of SSD packages according to the invention concept. In particular, FIG. 4 shows a possible arrangement of the main elements of each of the SSD packages 1000, 1000a, and 1000b of FIGS. 1 to 3.

Referring to FIG. 4, the SSD package 1000 includes the lower package 100, and the upper packages 200 and 300 disposed on the lower package 100 as connected to the lower package 100 in a PoP manner. The upper packages 200 and 300 may be the non-volatile memory package 200 and the individual electronic component package 300, respectively.

The non-volatile memory package 200 may be disposed on the lower package 100 to span the semiconductor memory chip 130 of the lower package 100. The individual electronic component package 300 may be disposed on the lower package 100 so as to overlap the controller chip 120 of the lower package 100.

The non-volatile memory package 200 or the non-volatile semiconductor memory chip 220 (or more specifically with respect to the latter, the footprint 220-1 of the stack of chips 220) may overlap the controller chip 120 of the lower package 100, but the inventive concept is not limited thereto. The area of overlap between the controller chip 120 and the non-volatile memory package 200 may be smaller than the area of overlap between the controller chip 120 and the individual electronic component package 300. Alternatively, the controller chip 120 may not overlap the non-volatile memory package 200, or may not overlap the non-volatile memory semiconductor chip 220-1.

The semiconductor memory chip 130 and the controller chip 120 may be mounted to the lower package 100 as adjacent the first edge 100L (left side in the figure) of the lower package substrate 110 and the second edge 100R (right side) that face in opposite directions. The non-volatile memory package 200 and the individual electronic component package 300 may be disposed on the lower package 100 so as to be adjacent to the first edge 100L and the second edge 100R, respectively.

The controller chip 120 may consume more power and generate more heat than the semiconductor memory chip 130. The second individual electronic component 320 (see FIGS. 1 to 3) of the individual electronic component package 300 may be relatively less sensitive to temperature variations than the non-volatile semiconductor memory chip 210 of the non-volatile memory package 200. Therefore, all or relatively large part of the controller chip 120 is disposed to overlap the individual electronic component package 300 in the SSD package 1000, and thus, characteristic degradation caused by the heat generated from the controller chip 120 may be minimized.

Because the upper packages 200 and 300, that is, the non-volatile memory package 200 and the individual electronic component package 300, are discrete packages the manufacturing yield of the non-volatile memory package 200 may be improved. In addition, warpage that may occur when the relatively thin lower package 100 and the relatively thick upper packages 200 and 300 are connected to each other in a PoP manner may be mitigated, and even when warpage occurs, the upper packages 200 and 300 are not likely to be damaged.

In FIG. 4 and the other plan views of the present specification, the upper packages 200 and 300 are shown as spaced apart from sides of the lower package 100 in order to allow the lower package 100 and the upper packages 200 and 300 to be distinguished from each other, but respective sides of the upper packages 200 and 300 may align with respective ones of the sides of the lower package 100.

Figure 5:
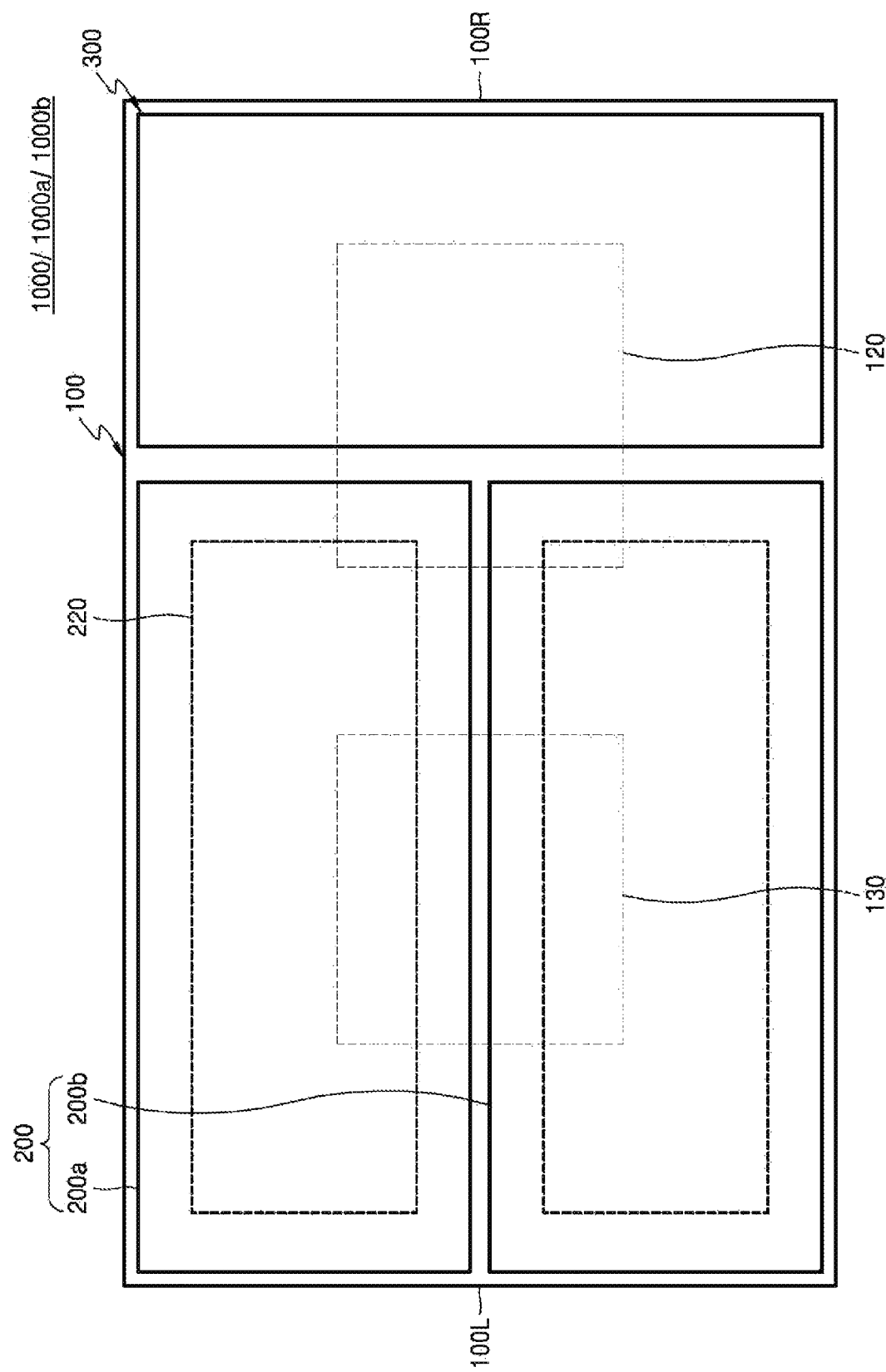
FIG. 5 is a plan view of an arrangement of main elements of an example of an SSD package according to the inventive concept.

FIG. 5 is a plan view of another arrangement of main elements of SSD packages 1000, 1000a or 1000b according to the inventive concept.

Referring to FIG. 5, the SSD package 1000 as an example includes the lower package 100 and the upper packages 200 and 300 disposed on the lower package 100 as connected to the lower package 100 in a PoP manner. The upper packages 200 and 300 may be also be the non-volatile memory package 200 and the individual electronic component package 300, respectively.

The upper packages 200 include a first non-volatile memory package 200a and a second non-volatile memory package 200b. Also, although FIG. 5 shows only two non-volatile memory packages, the upper packages 200 may include three or more non-volatile memory package packages.

Because, the upper packages 200 and 300 include the first and second non-volatile memory packages 200a and 200b, and the individual electronic component package 300, warpage that may occur when the relatively thin lower package 100 and the relatively thick upper packages 200 and 300 are connected to each other in a PoP manner may be mitigated, and even when warpage occurs, damage to the upper packages 200 and 300 are not damaged.

Figure 6:
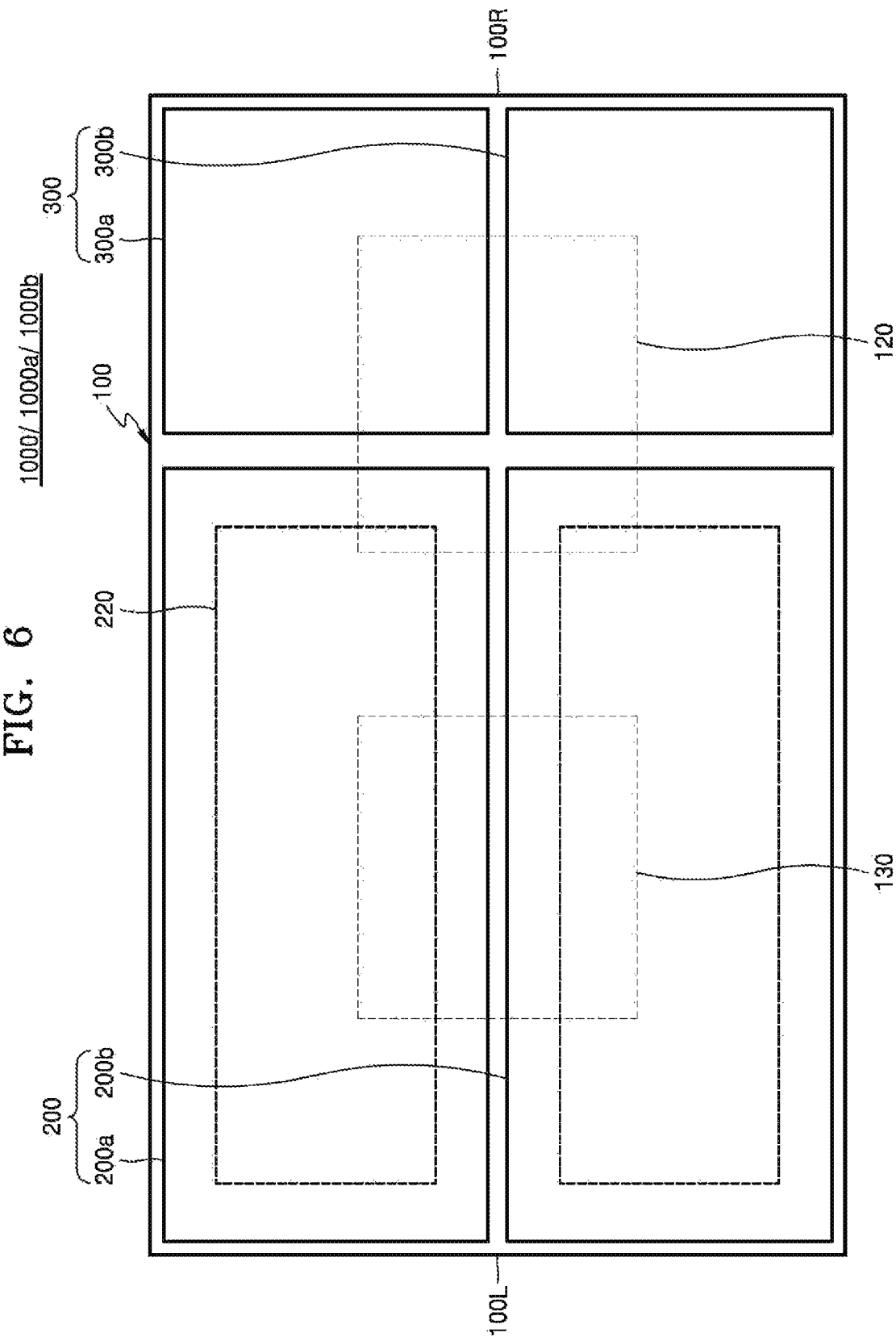
FIG. 6 is a plan view of an arrangement of main elements of an example of an SSD package according to the inventive concept.

FIG. 6 is a plan view showing another arrangement of main elements of the SSD packages 1000, 100a or 1000b according to the inventive concept.

Referring to FIG. 6, the SSD package 1000 as an example includes the lower package 100, and upper packages 200 and 300 disposed on the lower package 100 as connected to the lower package 100 in a PoP manner.

The upper packages 200 may include the first non-volatile memory package 200a and the second non-volatile memory package 200b. The upper packages 300 may include a first individual electronic component package 300a and a second individual electronic component package 300b. Although FIG. 6 shows the upper packages 300 as including only the first individual electronic component package 300a and the second individual electronic component package 300b, the inventive concept is not limited thereto, that is, the upper packages 300 may include three or more individual electronic component packages.

Because the upper packages 200 and 300 include discrete first and second non-volatile memory packages 200a and 200b and first and second individual electronic component packages 300a and 300b, warpage that may occur when the relatively thin lower package 100 and the relatively thick upper packages 200 and 300 are connected to each other in a PoP manner may be mitigated, and even when warpage occurs, the upper packages 200 and 300 are not damaged.

Figure 7:
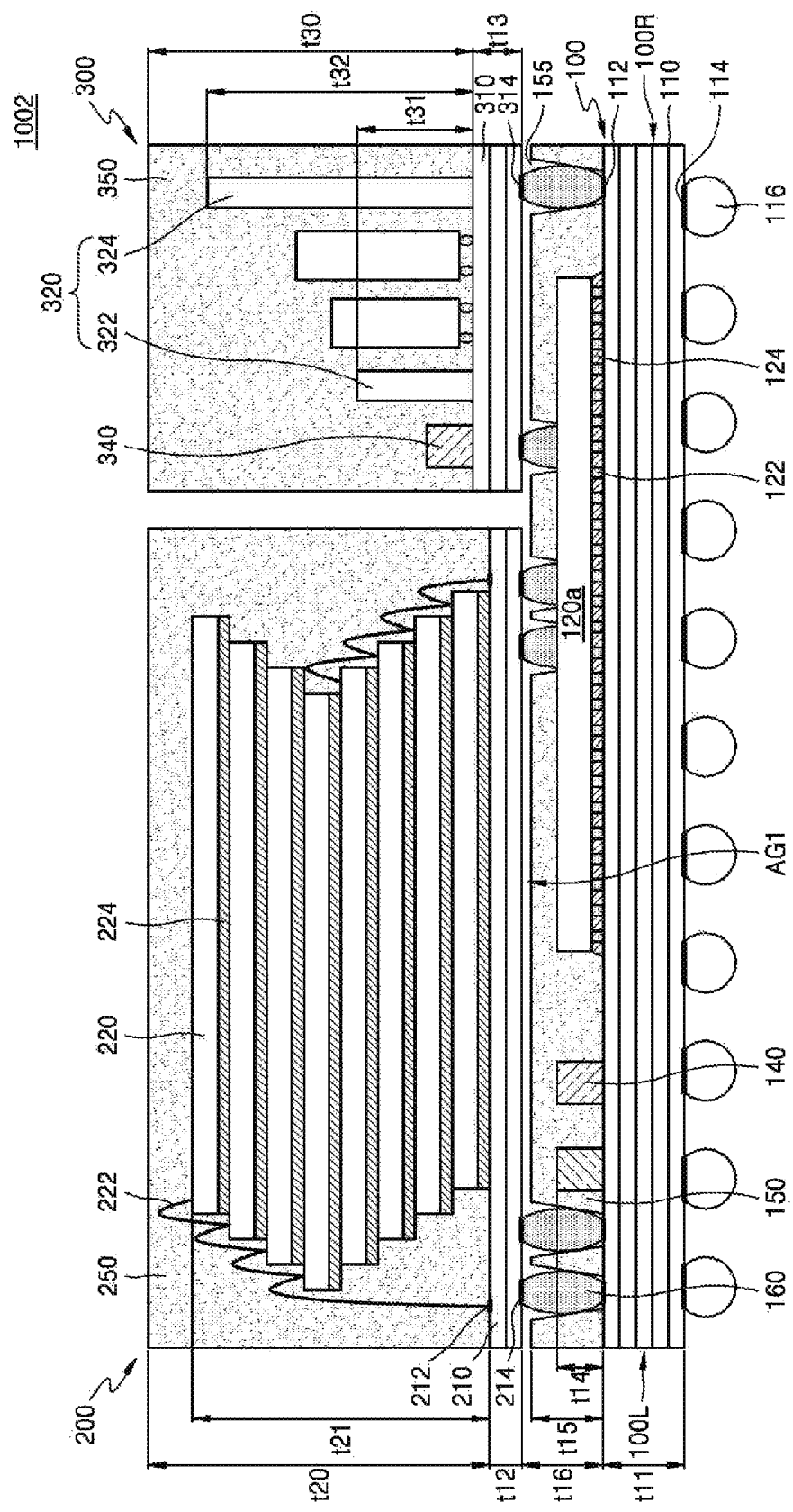
FIG. 7 is a cross-sectional view of an example of an SSD package according to the inventive concept.

FIG. 7 is a cross-sectional view of another example of an SSD package 1002 according to the inventive concept.

Referring to FIG. 7, the SSD package 1002 includes the lower package 100, and the upper packages 200 and 300 disposed on the lower package 100 as connected to the lower package 100 in a PoP manner.

The lower package 100 may include the lower package substrate 110 and a controller chip 120a mounted on the lower package substrate 110. The lower package 100 of the SSD package 1002 of FIG. 7 may be different from the lower package 100 of the SSD package 1000 shown in FIG. 1, in that the lower package 100 of FIG. 7 may not include the semiconductor memory chip 130 (see FIG. 1). The controller chip 120a may provide a cache, in addition to the functions performed by the controller chip 120 of FIG. 1. For example, the controller chip 120a may be an integrated semiconductor chip in which the controller chip 120 of FIG. 1 and the semiconductor memory chip 120 are integrated.

The controller chip 120a may be mounted to the lower package substrate 110 as disposed closer to the second edge 100R of the lower package 100 than to the first edge 100L.

In another example, the non-volatile memory package 200 of the SSD package 1002 may be of the same type as the non-volatile memory package 200 of FIG. 2, or the lower mold layer 150 may be omitted as in the example shown in FIG. 3.

Figure 8:
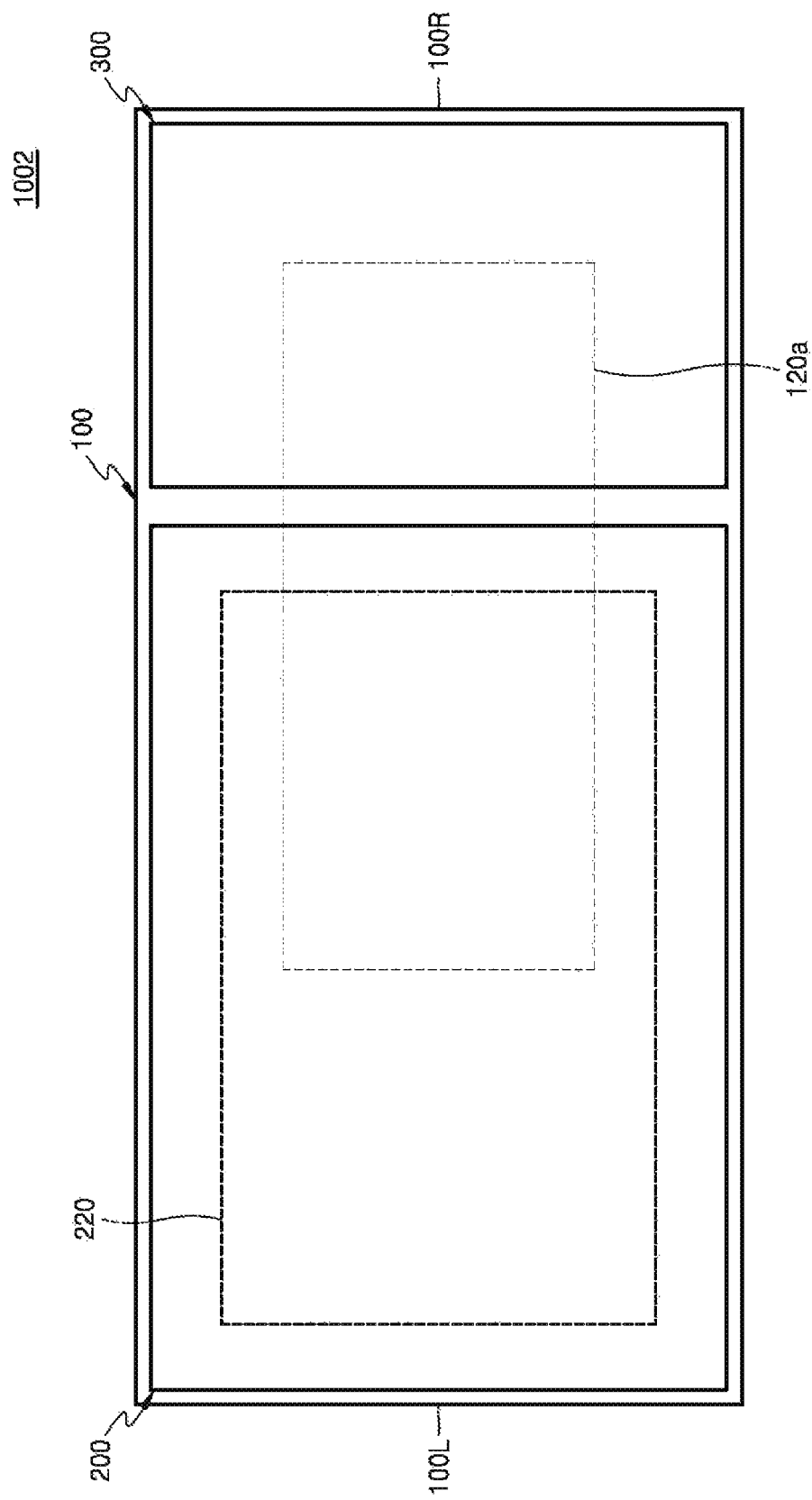
FIG. 8 is a plan view of main elements of an example of an SSD package according to the inventive concept.

FIG. 8 is a plan view of arrangements of main elements of the SSD package 1002 according to the inventive concept. More specifically, FIG. 8 shows arrangements of the main elements of the SSD package 1002 of FIG. 7.

Referring to FIG. 8, the SSD package 1002 includes the lower package 100 and the upper packages 200 and 300 disposed on the lower package 100 as connected to the lower package in a PoP manner. The controller chip 120a may be mounted to the lower package substrate 110 as disposed closer to the second edge 100R than to the first edge 100L of the lower package 100. The individual electronic component package 300 may be disposed on the lower package 100 so as to overlap the controller chip 120a of the lower package 100. The non-volatile memory package 200 or the non-volatile semiconductor memory chip 220 may overlap the controller chip 120a of the lower package 100, but is not limited thereto.

Although not shown in FIG. 8, the SSD package 1002 may include a plurality of non-volatile memory packages 200 and/or a plurality of individual electronic component packages 300, as shown in FIG. 5 or FIG. 6.

Figure 9:
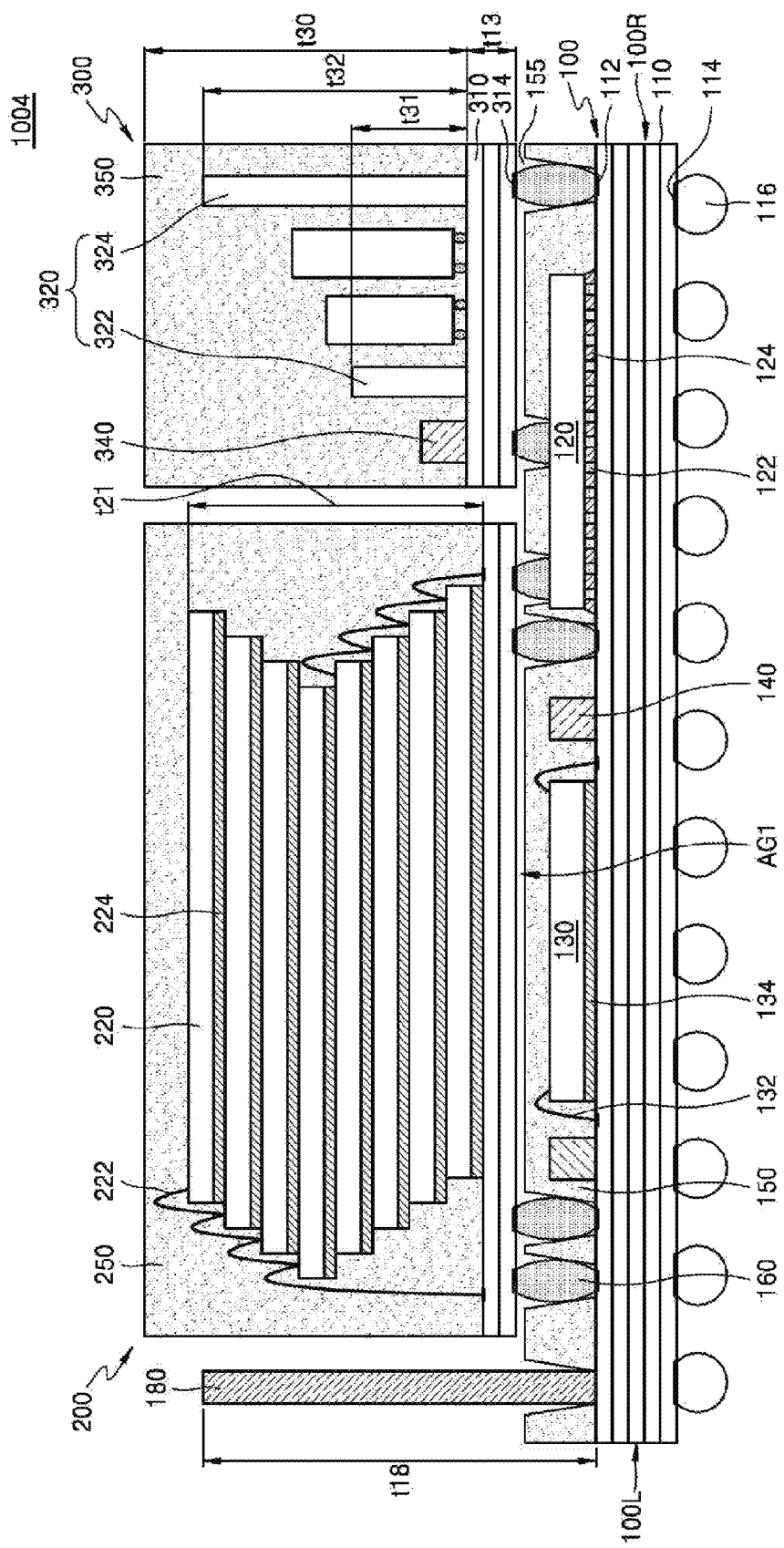
FIG. 9 is a cross-sectional view of an example of an SSD package according to the inventive concept.

FIG. 9 is a cross-sectional view of another example of an SSD package 1004 according to the inventive concept.

Referring to FIG. 9, the SSD package 1004 includes the lower package 100 and the upper packages 200 and 300 disposed on the lower package 100 as connected to the lower package 100 in a PoP manner.

The SSD package 1004 may further include a fourth individual electronic component 180 disposed on and mounted to the lower package substrate 110. The fourth individual electronic component 180 may be laterally spaced apart from the upper packages 200 and 300. A thickness t18 of the fourth individual electronic component 180 may be greater than a total thickness t21 of the plurality of non-volatile semiconductor chips 220 that are stacked. Alternatively, the thickness t18 of the fourth individual electronic component 180 may be greater than a thickness t30 of the second upper mold layer 350. The thickness t18 of the fourth individual electronic component 180 may be greater than a total thickness t13+t30 of the individual electronic component package 300. An uppermost part of the fourth individual electronic component may be located at a level that is equal to or lower than those of the upper surfaces of the upper packages 200 and 300.

Therefore, even though the fourth individual electronic component 180 has a relatively large thickness or great height, there is no need to increase the thickness of the upper packages 200 and 300, in particular, the individual electronic component package 300, and thus, the total thickness of the SSD package 1004 may be kept to a minimum.

In FIG. 9, the fourth individual electronic component 180 is shown as adjacent to the first edge 100L, but the inventive concept is not limited thereto. That is, the fourth individual electronic component 180 may be mounted anywhere on the lower package substrate 110, as long as it is laterally spaced apart from the upper packages 200 and 300.

In other examples, the non-volatile memory package 200 of the SSD package 1004 may be of the same type as the non-volatile memory package 200 of FIG. 2. Also, the lower mold layer 150 may be omitted as in the example of FIG. 3, and the SSD package 1004 may include the controller chip 120a of FIG. 7 instead of the controller chip 120 and the semiconductor memory chip 130.

Figure 10:
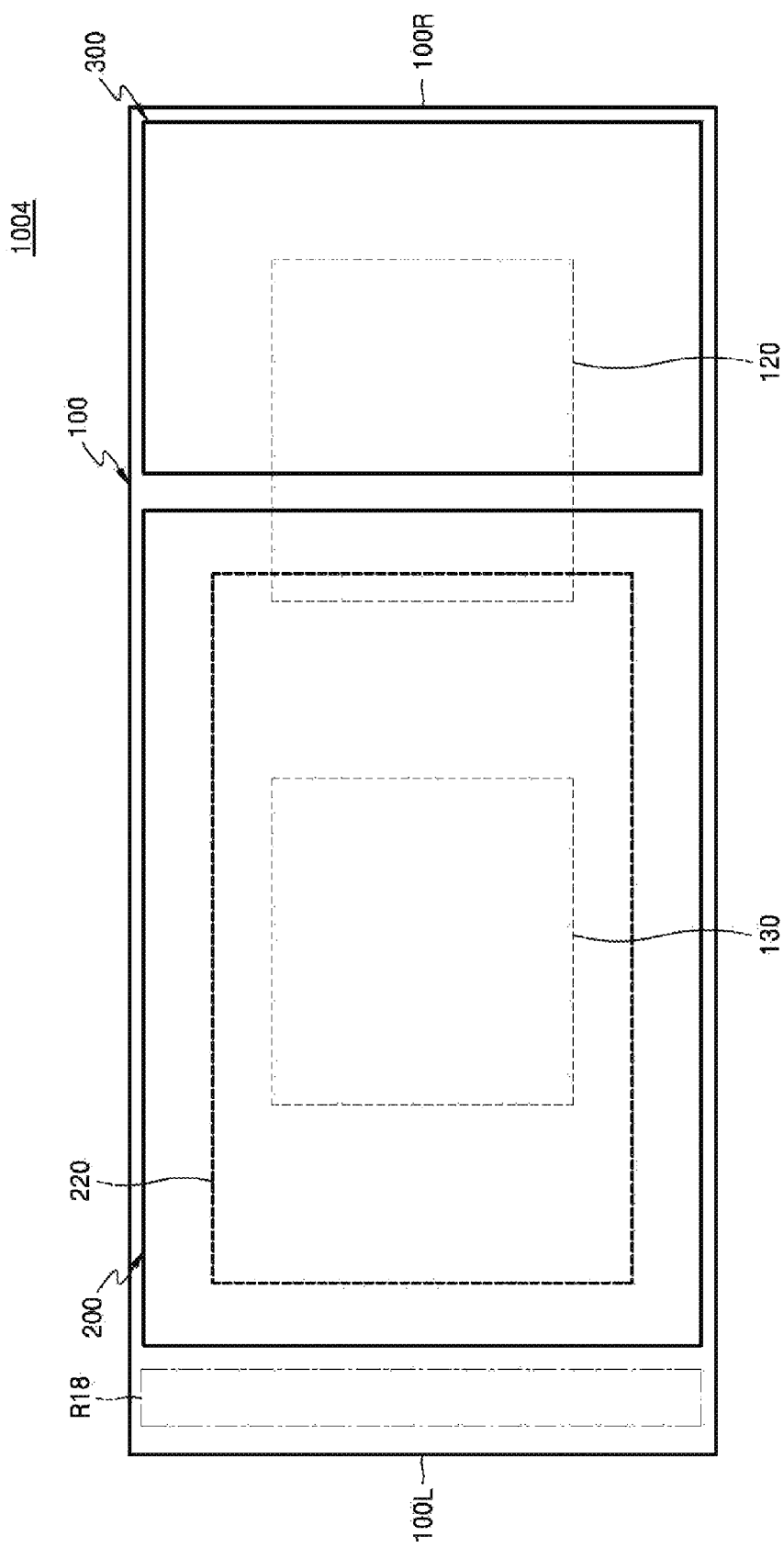
FIG. 10 is a plan view of an arrangement of main elements of an example of an SSD package according to the inventive concept.

FIG. 10 is a plan view of an example of arrangements of main elements in the SSD package 1004 according to the inventive concept. In particular, FIG. 10 shows the arrangements of the main elements in the SSD package 1004 of FIG. 9.

Referring to FIG. 10, the SSD package 1004 includes the lower package 100 and the upper packages 200 and 300 disposed on the lower package 100 as connected to the lower package in a PoP manner.

The fourth individual electronic component 180 may be disposed on a first mounting region R18 spaced apart from the upper packages 200 and 300. The fourth individual electronic component 180 may be spaced apart from the controller chip 120 and the semiconductor memory chip 130.

In another example, the SSD package 1004 may include a plurality of non-volatile memory packages 200 and/or a plurality of individual electronic component packages 300 as shown in FIG. 5 or FIG. 6.

Figure 11:
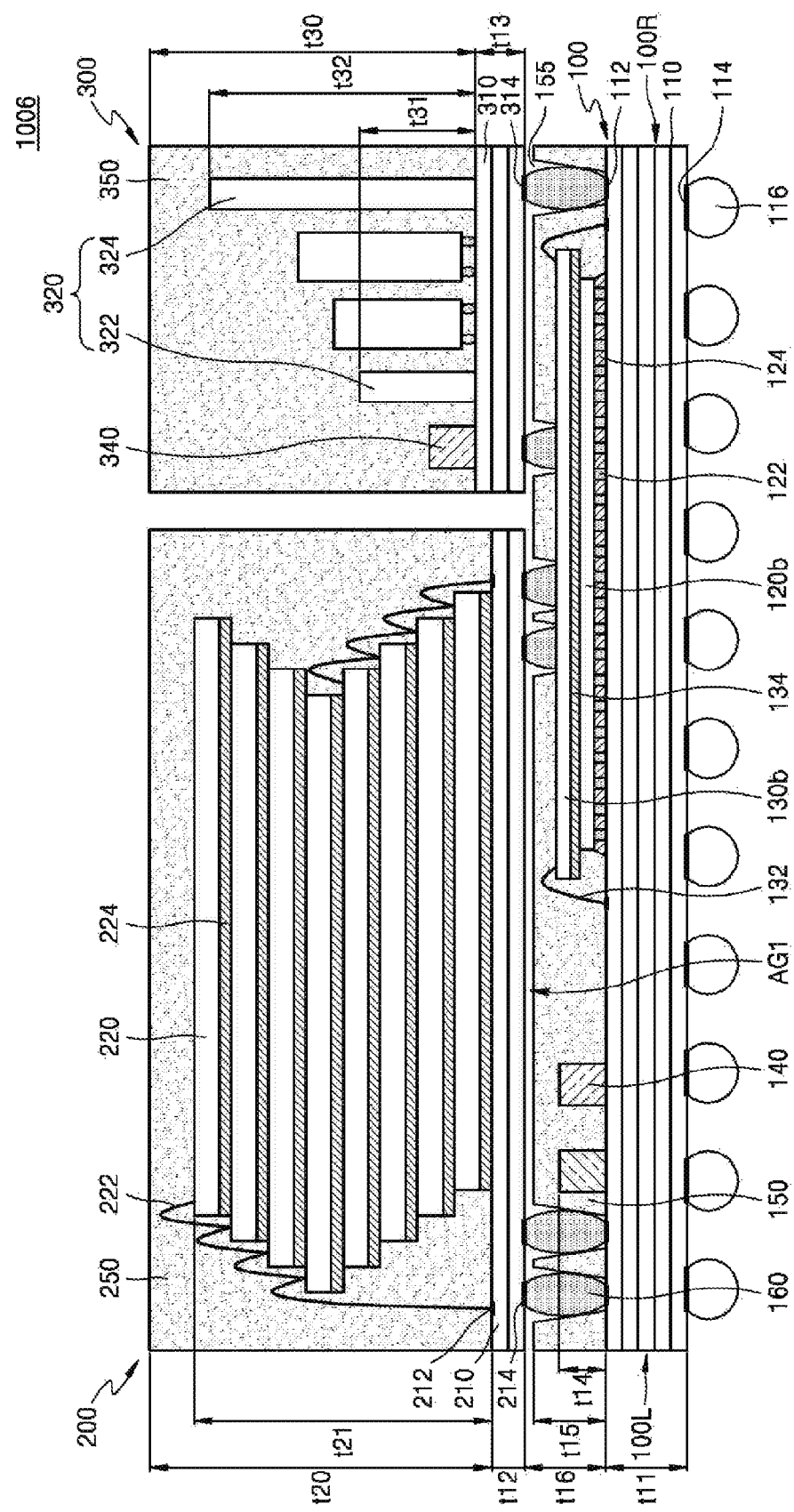
FIG. 11 is a cross-sectional view of an example of an SSD package according to the inventive concept.

FIG. 11 is a cross-sectional view of another example of an SSD package 1006 according to the inventive concept.

Referring to FIG. 11, the SSD package 1006 includes the lower package 100 and the upper packages 200 and 300 disposed on the lower package 100 as connected to the lower package in a PoP manner.

The lower package 100 may include a controller chip 120b mounted on the lower package substrate 110 and a semiconductor memory chip 130b stacked on the controller chip 120b. The controller chip 120b and the semiconductor memory chip 130b that are stacked may be mounted on the lower package substrate 110 as disposed closer to the second edge 100R than to the first edge 100L.

In other examples, the non-volatile memory package 200 of the SSD package 1006 may be of the type shown in FIG. 2, the lower mold layer 150 may be omitted as in the example shown in FIG. 3, and/or the SSD package 1006 may further include the fourth individual electronic component 180 of the example of FIG. 9.

Figure 12:
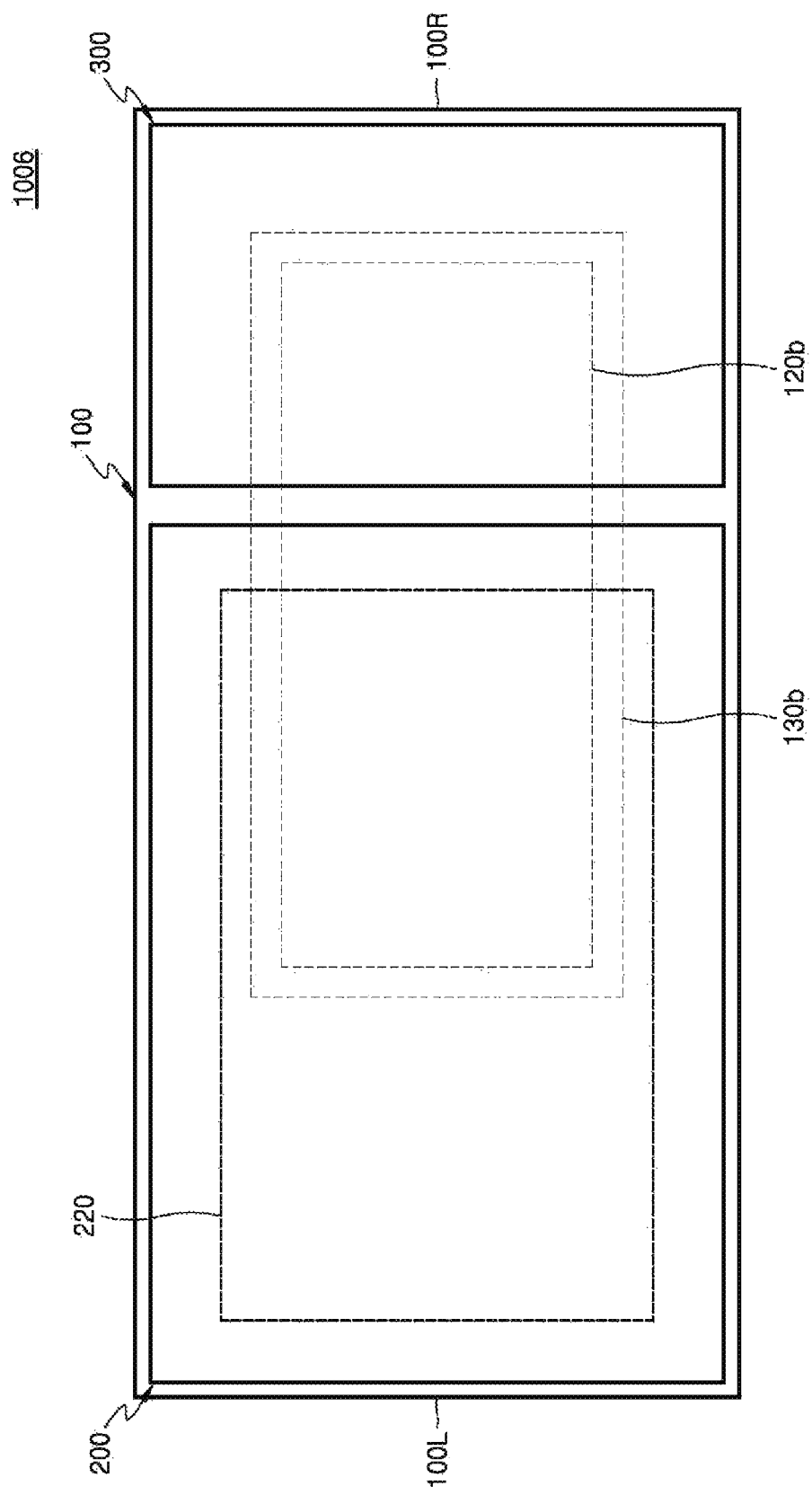
FIG. 12 is a plan view of an arrangement of main elements of an SSD package according to an example.

FIG. 12 is a plan view of an example of the arrangement of main elements of the SSD package 1006 according to the inventive concept. In particular, FIG. 12 shows the arrangement of the main elements of the SSD package 1006 of FIG. 11.

Referring to FIG. 12, the SSD package 1006 includes the lower package 100 and the upper packages 200 and 300 disposed on the lower package 100 as connected to the lower package in a PoP manner.

The lower package 100 may include the controller chip 120b and the semiconductor memory chip 130b stacked on the controller chip 120b. In the example of FIG. 12, the semiconductor memory chip 130b has an area that is greater than that of the controller chip 120b, but the inventive concept is not limited thereto. That is, the area of the semiconductor memory chip 130b may be smaller than that of the controller chip 120b.

In another example, the SSD package 1006 may include a plurality of non-volatile memory packages 200 and/or a plurality of individual electronic component packages 300, as shown in FIG. 5 or FIG. 6.

Figure 13:
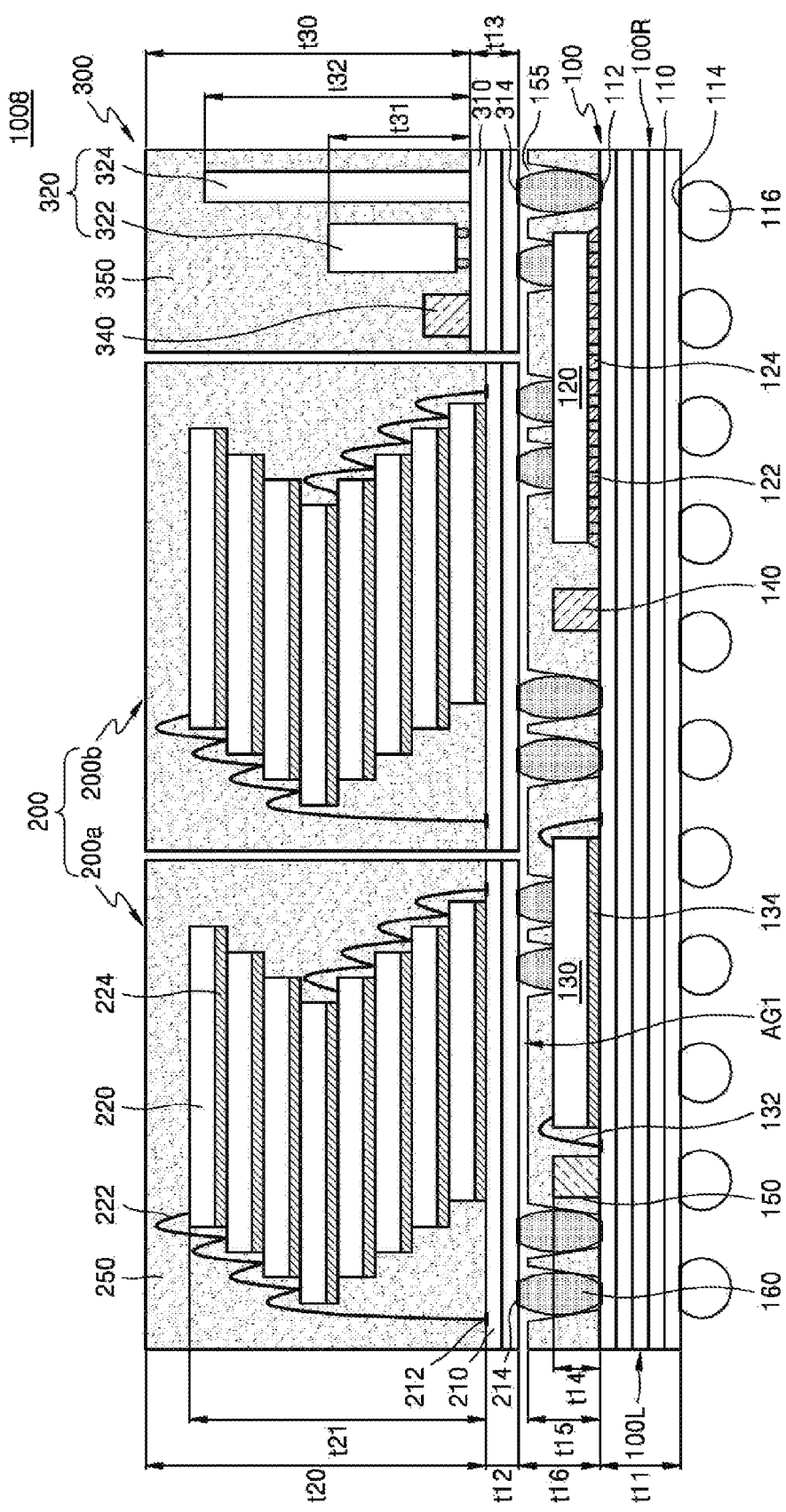
FIG. 13 is a cross-sectional view of an example of an SSD package according to the inventive concept.

FIG. 13 is a cross-sectional view of another example of an SSD package 1008 according to the inventive concept.

Referring to FIG. 13, the SSD package 1008 includes the lower package 100 and the upper packages 200 and 300 disposed on the lower package 100 as connected to the lower package in a PoP manner.

The upper packages 200 include the first non-volatile memory package 200a and the second non-volatile memory package 200b. The first non-volatile memory package 200a may be mounted on the lower package substrate 110 adjacent to the first edge 100L, the individual electronic component package 300 may be mounted on the lower package substrate 110 adjacent to the second edge 100R, and the second non-volatile memory package 200b may be mounted on the lower package substrate 110 as interposed between the first non-volatile memory package 200a and the individual electronic component package 300. The first non-volatile memory package 200a and the second non-volatile memory package 200b may be mounted on the lower package 100 s laterally spaced apart from each other.

The non-volatile memory package 200 may overlap the semiconductor memory chip 130 of the lower package 100. The individual electronic component package 300 may overlap the controller chip 120 of the lower package 100. Therefore, in the SSD package 1008, the individual electronic component package 300 is disposed on the controller chip 120 dissipating relatively a large amount of heat, and thus, character degradation due to the heat generated from the controller chip 120 may be minimized.

In addition, if the SSD package 1008 is warped, the upper packages 200 and 300 that are relatively thick include the first non-volatile memory package 200a, the second non-volatile memory package 200b, and the individual electronic component package 300 that are discrete and spaced apart from each other, and thus, damage to the SSD package 1008 may be prevented.

In other examples of the SSD package 1008, each of the first and second non-volatile memory packages 200a and 200b may be of the same type as the non-volatile memory package 200 of FIG. 2, the lower mold layer 150 may be omitted as in the example of FIG. 3, the controller chip 120a of FIG. 7 may be employed instead of the controller chip 120 and the semiconductor memory chip 130, and/or the package may include the fourth individual electronic component 180 as in the example of FIG. 9. In another example, the SSD package 1008 may include the controller chip 120b and the semiconductor memory chip 130b stacked on the controller chip 120b shown in FIG. 11, instead of the controller chip 120 and the semiconductor memory chip 130.

Figure 14:
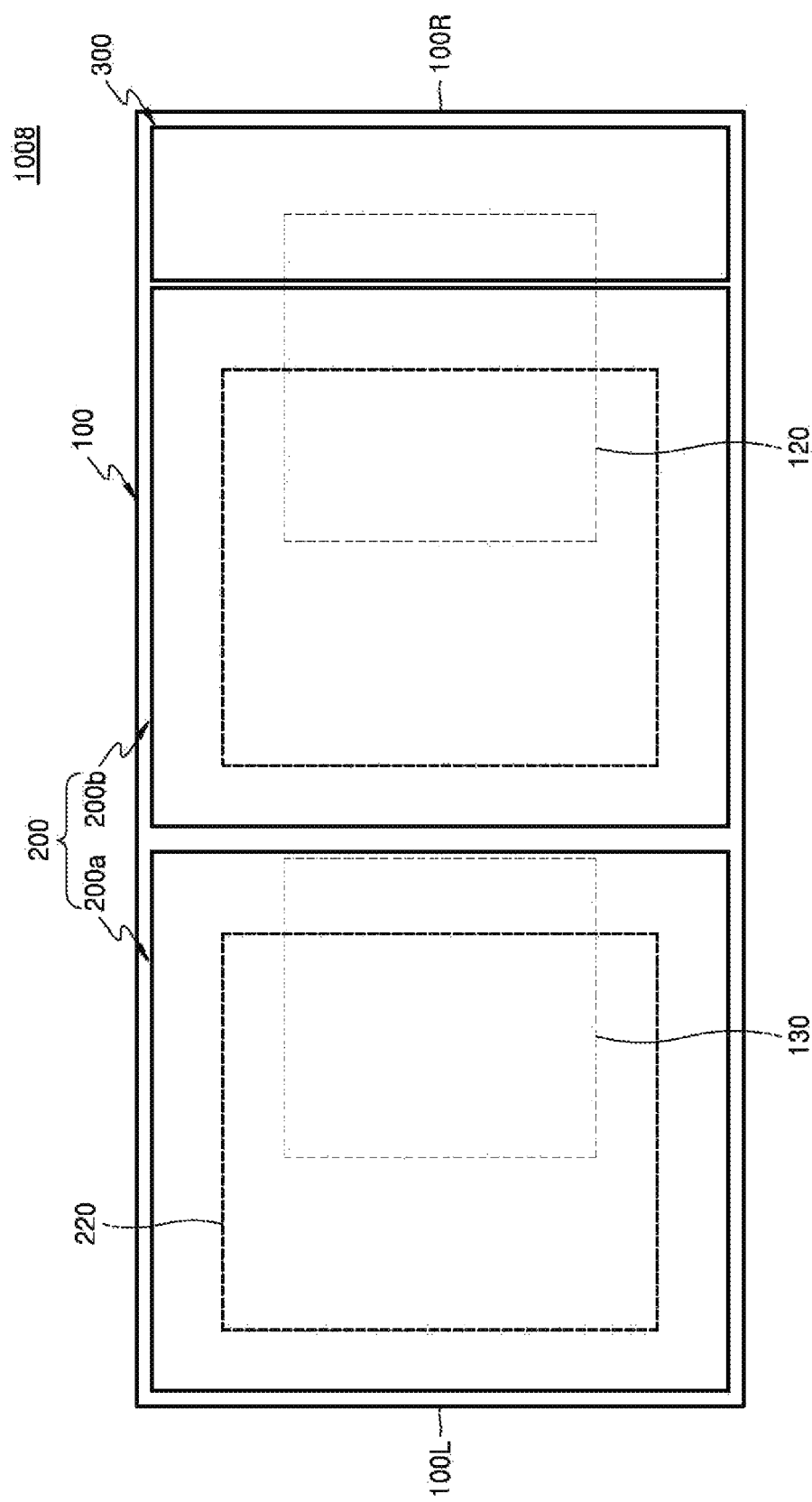
FIGS. 14, 15 and 16 are plan views of arrangements of main elements of examples of SSD packages according to the inventive concept.
Figure 15:
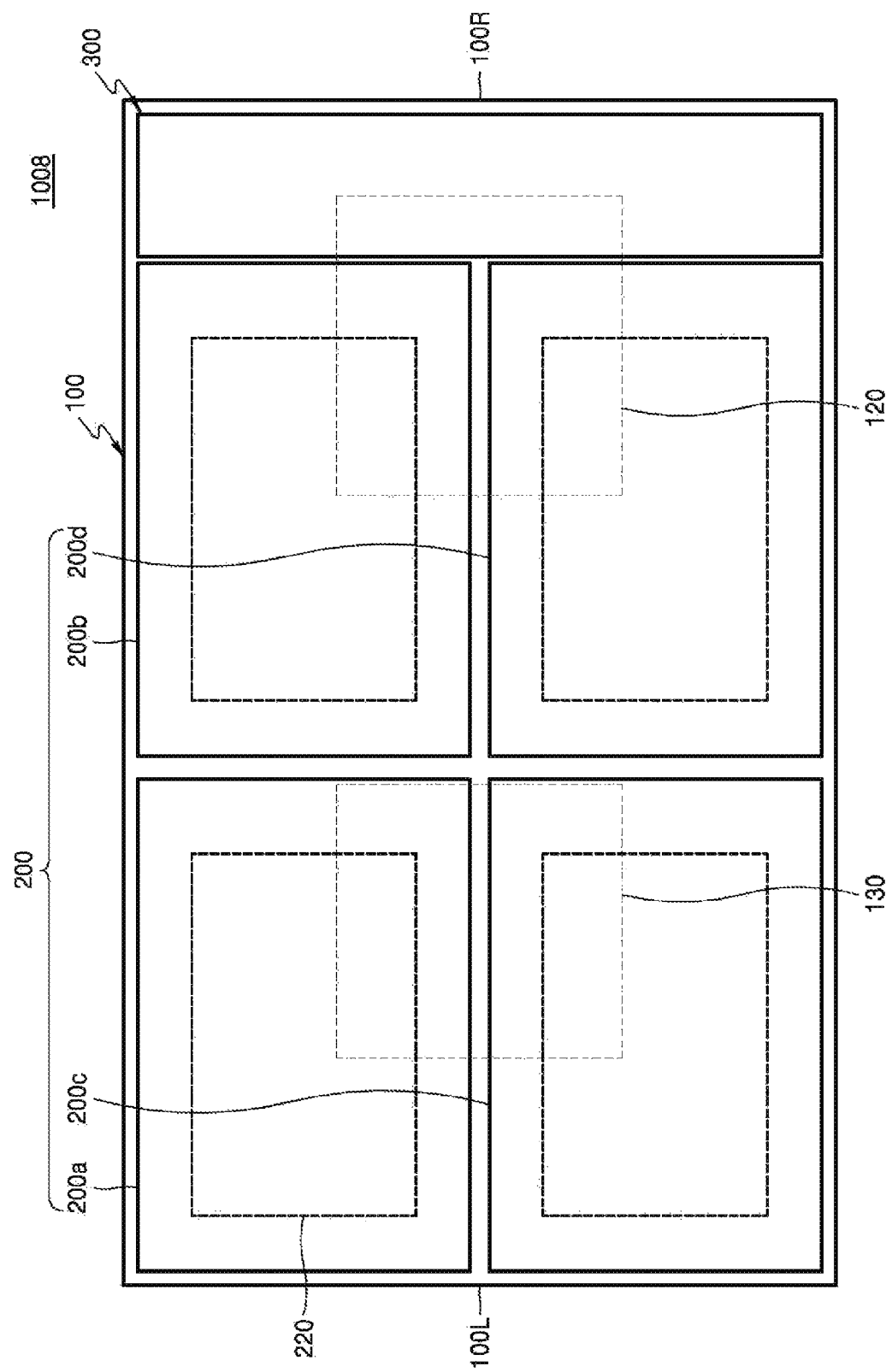
Figure 16:
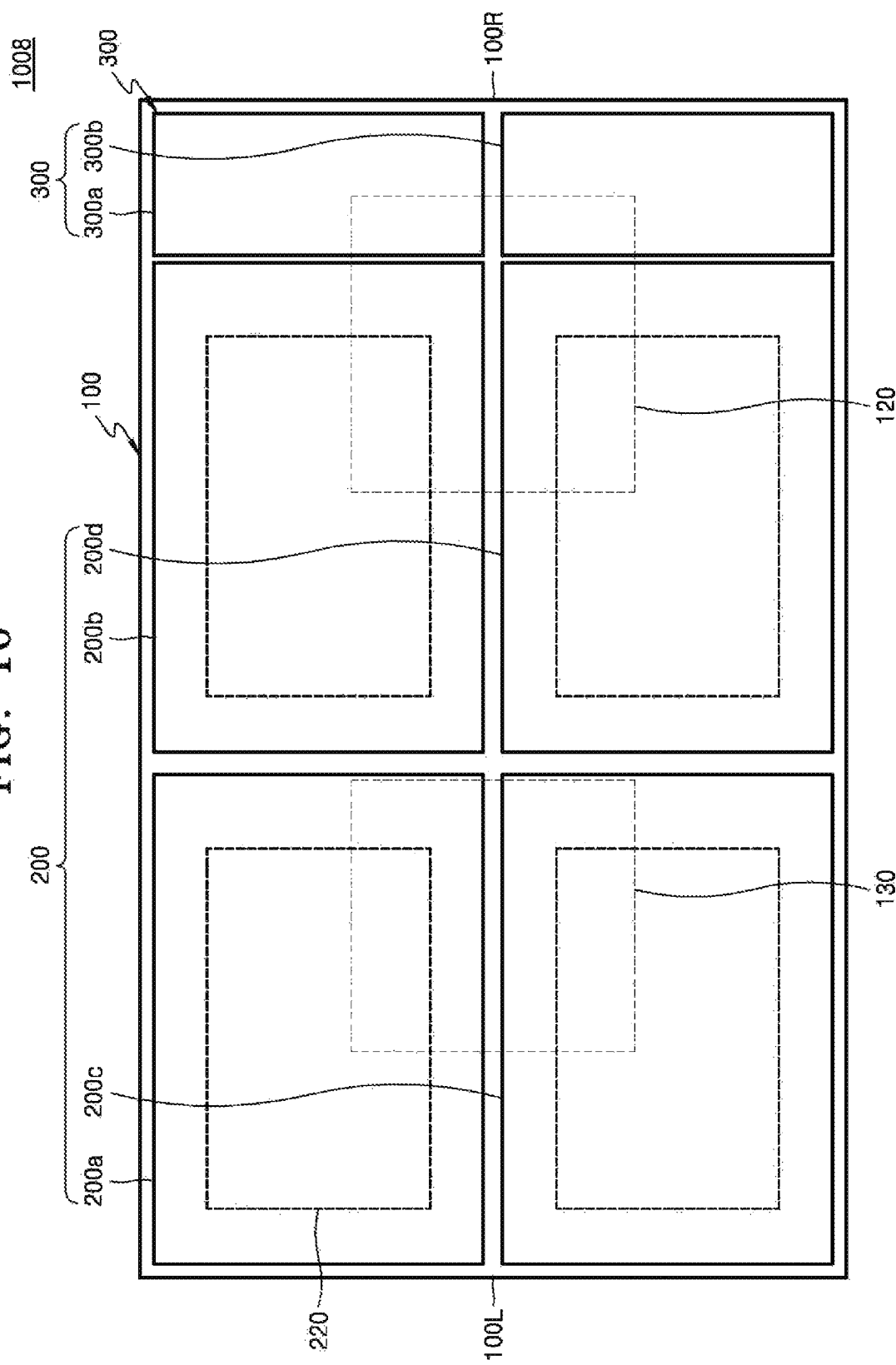

FIGS. 14 to 16 are plan views of examples of arrangements of main elements of the SSD package 1008 according to the inventive concept. In particular, FIGS. 14 to 16 show the arrangements of the main elements in the SSD package 1008 of FIG. 13.

Referring to FIG. 14, the SSD package 1008 includes the lower package 100 and the upper packages 200 and 300 disposed on the lower package 100 as connected to the lower package in a PoP manner. The first non-volatile memory package 200a may be mounted on the lower package substrate 110 as adjacent to the first edge 100L, the individual electronic component package 300 may be mounted on the lower package substrate 110 as adjacent to the second edge 100R, and the second non-volatile memory package 200b may be mounted on the lower package substrate 110 as interposed between the first non-volatile memory package 200a and the individual electronic component package 300.

The non-volatile memory package 200 may overlap with the semiconductor memory chip 130 of the lower package 100. The individual electronic component package 300 may overlap the controller chip 120 of the lower package 100.

Referring to FIG. 15, the non-volatile memory package 200 includes first to fourth non-volatile memory packages 200a, 200b, 200c, and 200d mounted on the lower package 100 as laterally spaced apart from each other.

Referring to FIG. 16, the SSD package may have first and second individual electronic component packages 300a and 300b.

As shown in FIGS. 14 to 16, the non-volatile memory package(s) 200 and/or the individual electronic component package(s) 300 of the SSD package 1008 are discrete components, and thus, warpage that may occur when the lower package 100 that is relatively thin and the upper packages 200 and 300 that are relatively thick are connected in a PoP manner may be minimized. In addition, even if warpage has occurred, damage to the upper packages 200 and 300 may be prevented.

Figure 17:
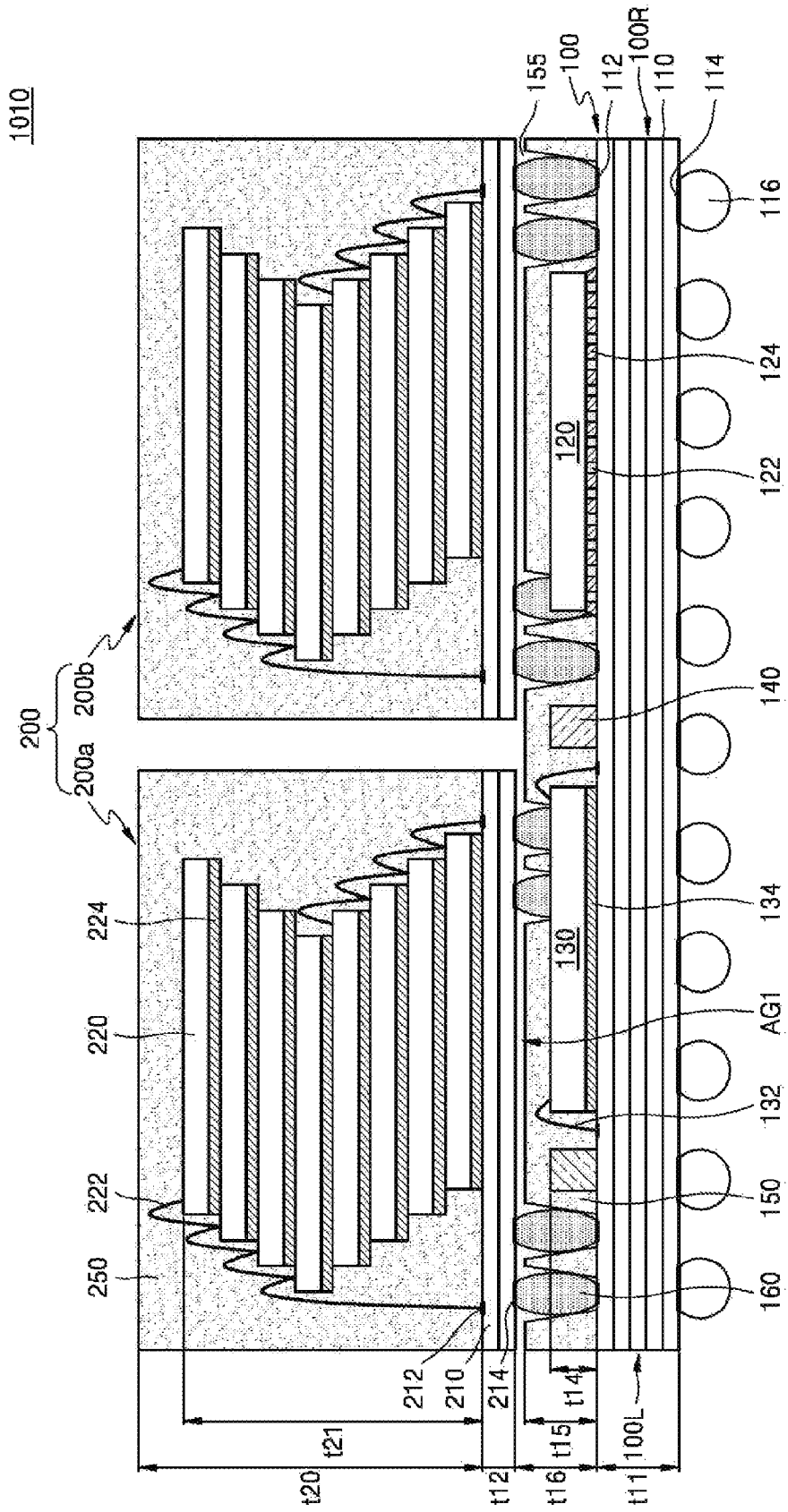
FIG. 17 is a cross-sectional view of an example of an SSD package according to the inventive concept.

FIG. 17 is a cross-sectional view of another example of an SSD package 1010 according to the inventive concept.

Referring to FIG. 17, the SSD package 1010 includes the lower package 100 and upper packages 200 disposed on the lower package 100 as connected to the lower package 100 in a PoP manner. The upper packages 200 include the first non-volatile memory package 200a and the second non-volatile memory package 200b. Although in the example of FIG. 17, the upper packages 200 includes only a first non-volatile memory package 200a and a second non-volatile memory package 200b, the inventive concept is not limited thereto. That is, the upper packages 200 may include three or more packages.

In other examples of the SSD package 1010, each of the first and second non-volatile memory packages 200a and 200b may be of the same type as the non-volatile memory package 200 of FIG. 2, the lower mold layer 150 may be omitted as in the example of FIG. 3, the controller chip 120a of FIG. 7 may be used instead of the controller chip 120 and the semiconductor memory chip 130, and/or the SSD package 1010 may include the fourth individual electronic component 180 as in the example of FIG. 9. Also, the SSD package 1010 may include the controller chip 120b and the semiconductor memory chip 130b stacked on the controller chip 120b shown in FIG. 11, instead of the controller chip 120 and the semiconductor memory chip 130.

Figure 18:
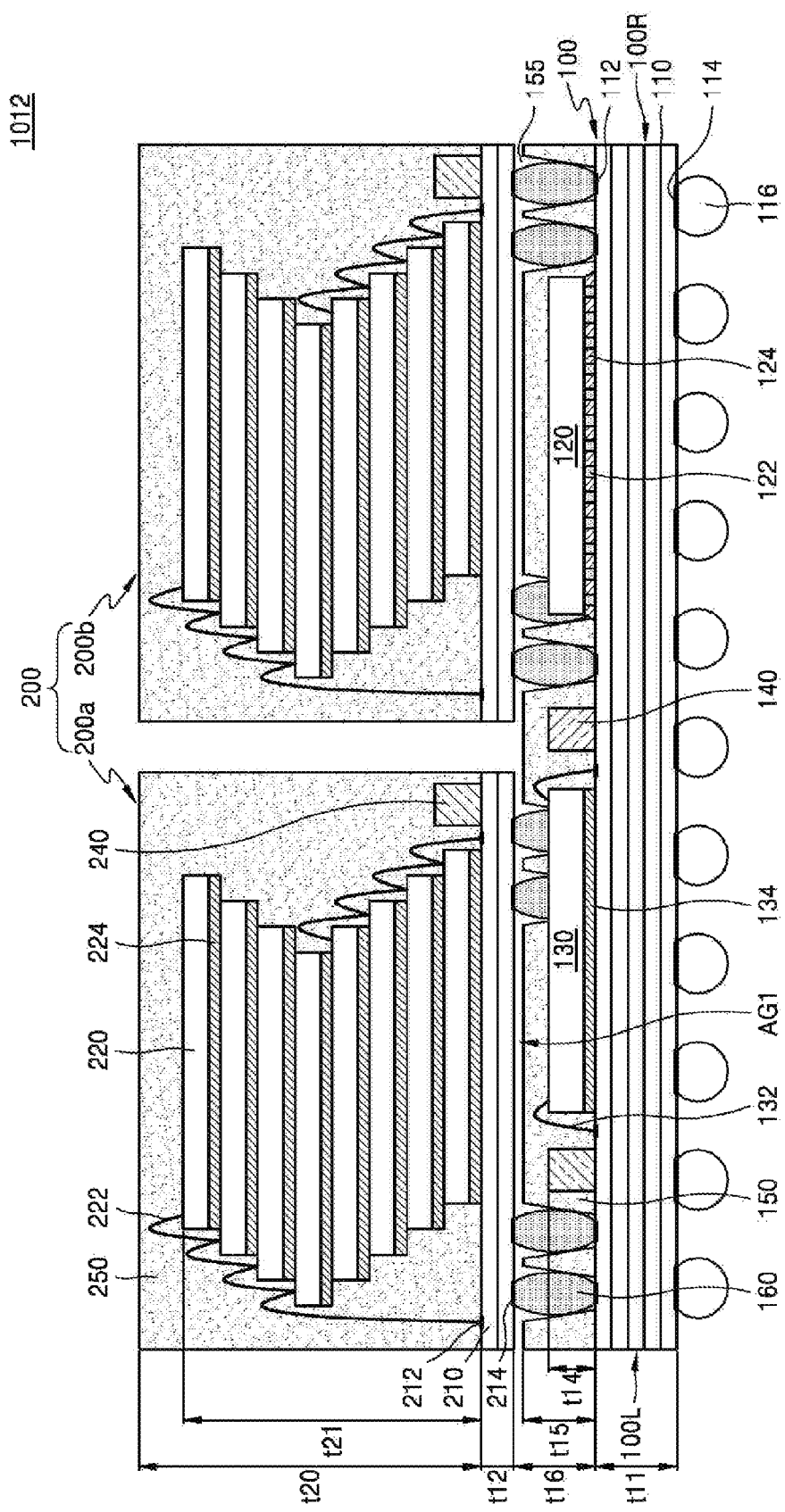
FIG. 18 is a cross-sectional view of an example of an SSD package according to the inventive concept.

FIG. 18 is a cross-sectional view of another example of an SSD package 1012 according to the inventive concept.

Referring to FIG. 18, the SSD package 1012 includes the lower package 100 and the upper packages 200 disposed on the lower package 100 as connected to the lower package 100 in a PoP manner. The upper packages 200 may include the first non-volatile memory package 200a and the second non-volatile memory package 200b.

Each of the first non-volatile memory package 200a and the second non-volatile memory package 200b may include a fifth individual electronic component 240. The fifth individual electronic component 240 may be, for example, a passive device such as a chip resistor, a chip capacitor, or an MLCC.

Referring to FIGS. 17 and 18, even though the SSD package 1010 or 1012 does not include an individual electronic component having relatively large height, the non-volatile memory packages 200a and 200b are disposed on the lower package 100 as laterally spaced apart from each other. Thus, warpage that may occur when the lower package 100 that is relatively thin and the upper packages 200 that are relatively thick are connected to each other in a PoP manner may be minimized, and even if the warpage has occurred, damage to the upper packages 200 may be prevented.

Figure 19:
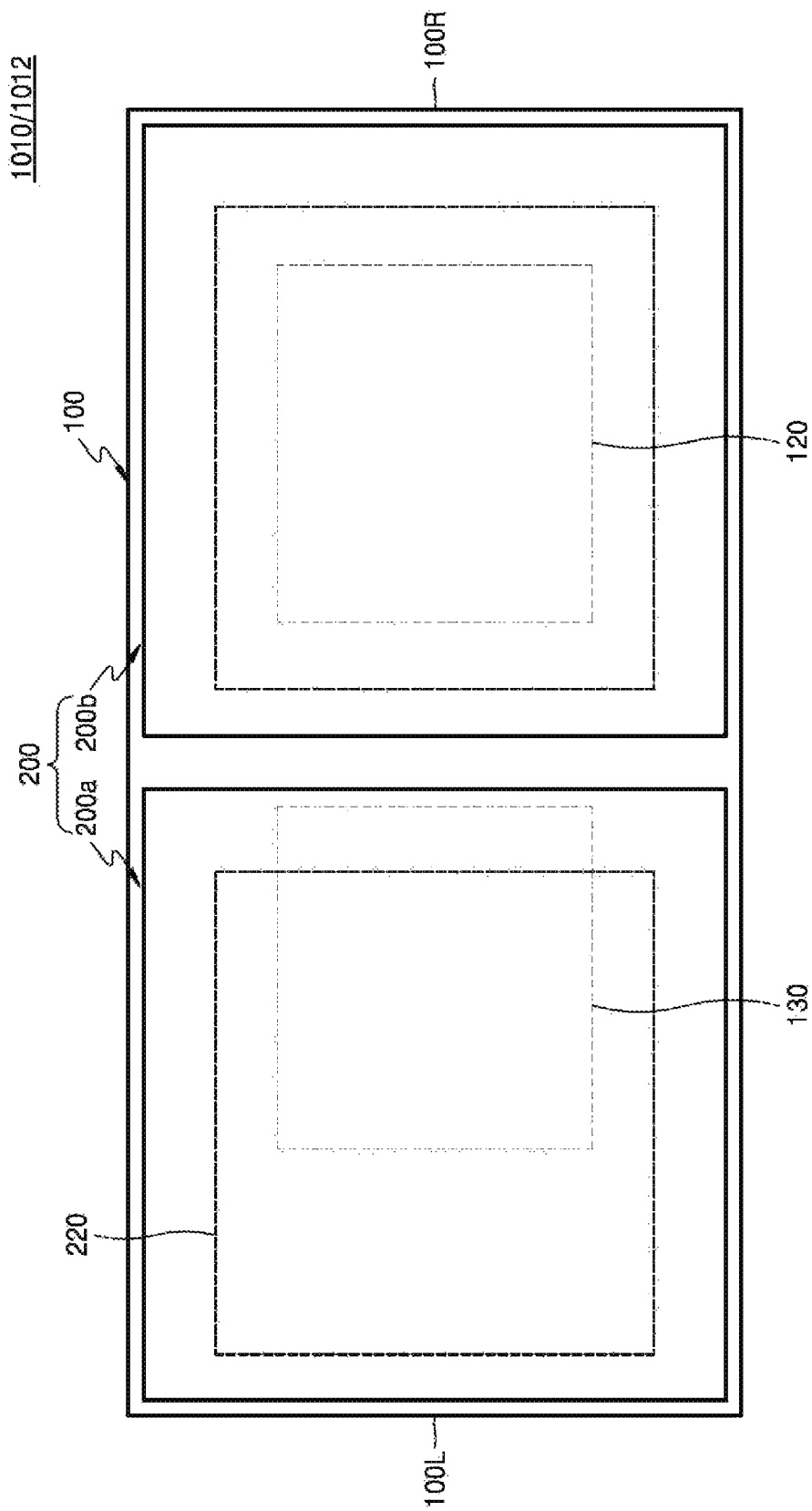
FIGS. 19 and 20 are plan views of arrangements of main elements of an example of an SSD package according to the inventive concept.
Figure 20:
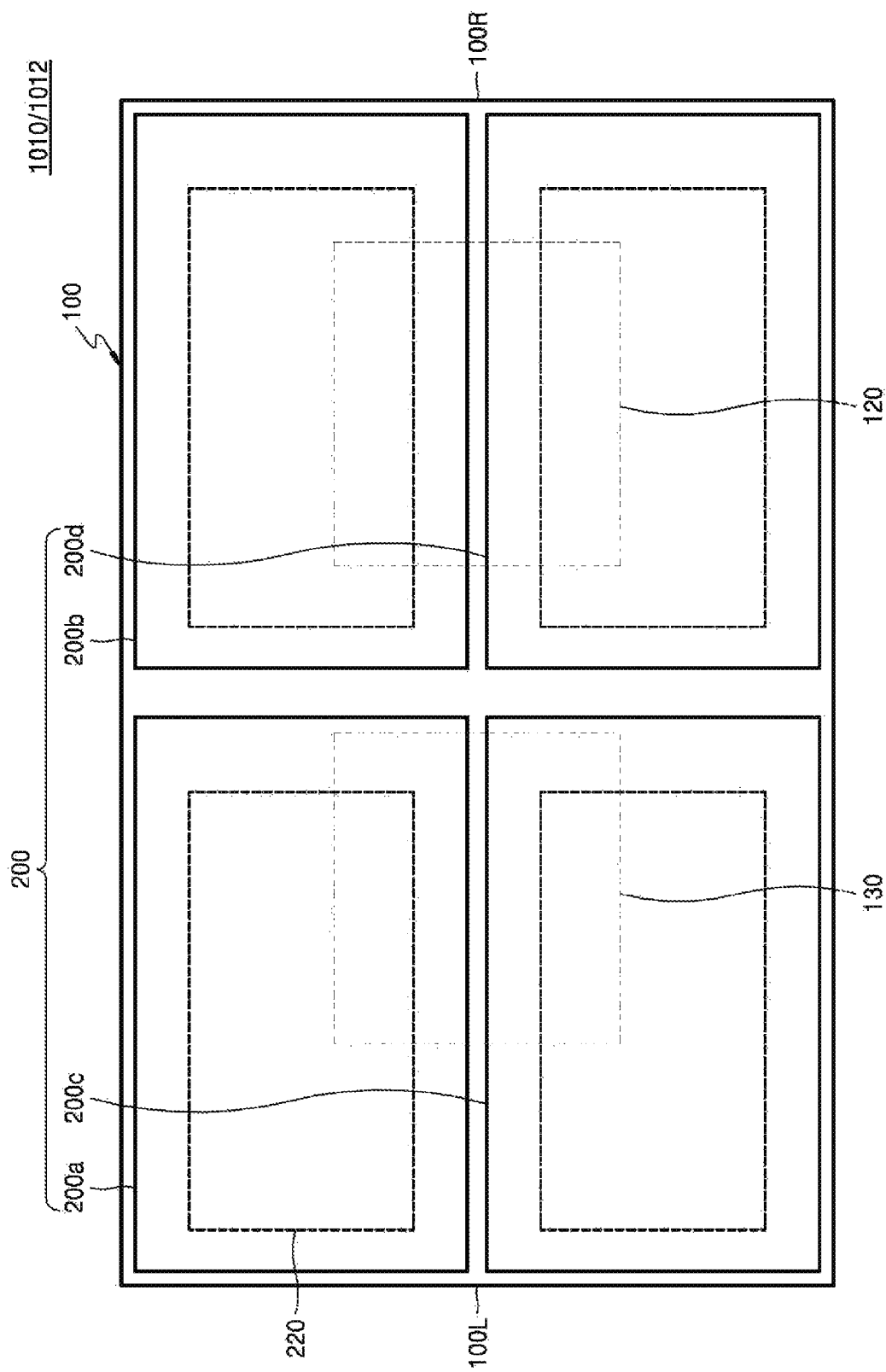

FIGS. 19 and 20 are plan views of arrangements of main elements of the SSD package 1010 or 1012. In particular, FIGS. 19 and 20 show the arrangements of the main elements of the SSD package 1010 or 1012 shown in FIG. 17 or 18.

Referring to FIG. 19, the SSD package 1010 or 1012 includes the lower package 100 and the upper packages 200 (e.g., the first non-volatile memory package 200a and the second non-volatile memory package 200b) disposed on the lower package 100 as connected to the lower package 100 in a PoP manner. The first non-volatile memory package 200a and the second non-volatile memory package 200b may be disposed adjacent to the first edge 100L and the second edge 100R of the lower package 100, respectively. If warpage occurs in a direction perpendicular to the first and second edges 100L and 100R in the lower package 100 because of a difference between the amounts of heat generated by the controller chip 120 and the semiconductor memory chip 130, damage to the upper package 200 may be prevented.

Although in the example of FIG. 19 the upper packages 200 include the first non-volatile memory package 200a and the second non-volatile memory package 200b, the inventive concept is not limited thereto. That is, the upper package 200 may include three or more packages arranged in a direction from the first edge 100L to the second edge 100R.

Referring to FIG. 20, the SSD package 1010 or 1012 includes the lower package 100 and the upper package 200 disposed on the lower package 100 as connected to the lower package 100 in a PoP manner. The upper packages 200 include first to fourth non-volatile memory packages 200a, 200b, 200c, and 200d.

In FIG. 20, the upper packages 200 includes the first to fourth non-volatile memory packages 200a, 200b, 200c, and 200d, but is not limited thereto. That is, the upper packages 200 may include six or more packages.

Figure 21:
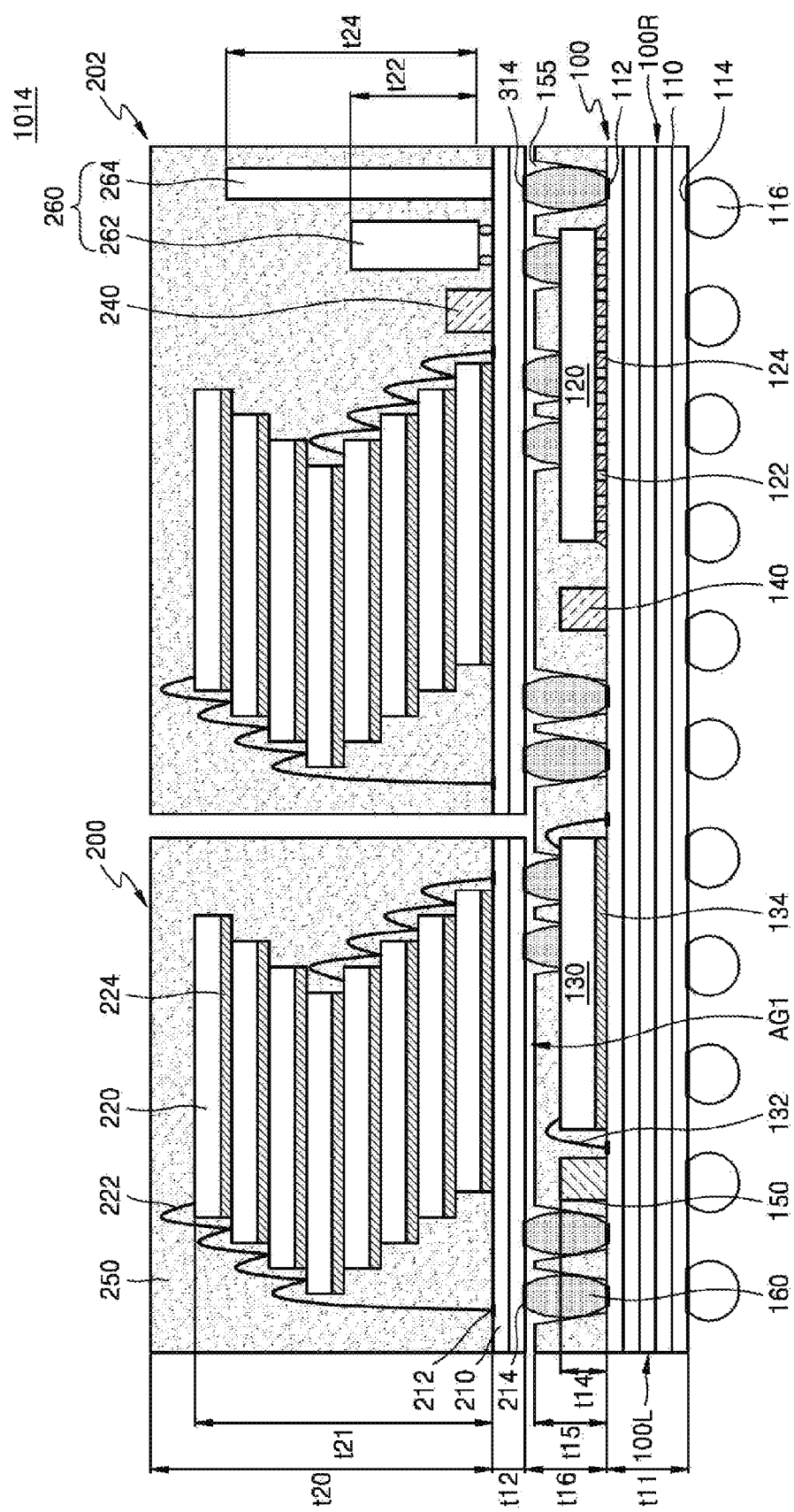
FIG. 21 is a cross-sectional view of an example of an SSD package according to the inventive concept.

FIG. 21 is a cross-sectional view of another example of an SSD package according to the inventive concepts.

Referring to FIG. 21, the SSD package 1014 includes the lower package 100 and upper packages 200 and 202 disposed on the lower package 100 as connected to the lower package 100 in a PoP manner. The upper package 200 may be referred to as a (second) non-volatile memory package 202 because it includes a non-volatile memory. The second non-volatile memory package 202 is similar to the first non-volatile memory package 200, but the second non-volatile memory package 202 further includes a plurality of sixth individual electronic components 260. Each of the plurality of sixth individual electronic components 260 may be an active device or a passive device, for example, a resistor, a capacitor, an inductor, a switch, a sensor, a DC-DC converter, quartz for generating clock signals, or a voltage regulator.

The plurality of sixth individual electronic components 260 may include a first component 262 and a second component 264. The first component 262 and the second component 264 of the second non-volatile memory package 202 may have different thickness t22 and t24 from each other. The thickness t22 of the first component 262, which is the smallest thickness among those of the plurality of sixth individual electronic components 260, may be greater than the thickness t15 of the lower mold layer 150. The thickness t22 may also be equal to or greater than the thickness t16 of the conductive connection member 160. Therefore, since the relatively thick sixth individual electronic components 260 are not part of the lower package 100, the total thickness of the SSD package 1014 may be kept to a minimum.

The thickness t24 of the second component 264 having the greatest thickness among those of the plurality of sixth individual electronic components 260 may be less than the thickness t20 of the first upper mold layer 250. Alternatively, the thickness t24 of the second component 264 may be less than the total thickness t21 of the plurality of non-volatile semiconductor memory chips 220. Therefore, the second non-volatile memory package 202 having the thickness that is similar to that of the first non-volatile memory package 200 includes the plurality of sixth individual electronic components 260 having the relatively large thicknesses, and thus, the total thickness of the SSD package 1014 may be kept to a minimum.

In some examples, the second non-volatile memory package 202 may further include a seventh individual electronic component 240. The seventh individual electronic component 240 may be a passive device, for example, a chip resistor, a chip capacitor, and a multi-layer ceramic capacitor (MLCC). A thickness of the seventh individual electronic component 240 may be similar to that of the first individual electronic component 140. For example, the thickness of the seventh individual electronic component 240 may be smaller than the thickness t15 of the lower mold layer 150. In FIG. 21, the second non-volatile memory package 202 includes the seventh individual electronic component 240 having the thickness that is less than the thickness t15 of the lower mold layer 150, but the inventive concept is not limited thereto. For example, the second non-volatile memory package 202 may only include the sixth individual electronic component 260 having the relatively large thickness, and may not include the third individual electronic component 340.

The first and second non-volatile memory packages 200 and 202 may be adjacent to the first edge 100L and the second edge 100R, respectively. The second non-volatile memory package 202 may be disposed closer to the second edge 100R than to the first edge 100L. The second non-volatile memory package 202 may overlap the controller chip 120 of the lower package 100. In particular, the second non-volatile memory package 202 may be disposed on the lower package 100 so that the sixth individual electronic component 260 may overlap the controller chip 120 of the lower package 100.

In the example of FIG. 21, the upper package substrates 210 of the first and second non-volatile memory packages 200 and 202 have thicknesses that are equal to each other, but the inventive concept is not limited thereto. For example, the second non-volatile memory package 202 may include an upper package substrate 210 that is greater than that of the first non-volatile memory package 200 in thickness.

The SSD package 1014 includes the first and second non-volatile memory packages 200 and 202 that are spaced from each other, and thus, warpage that may occur when the lower package 100 that is relatively thin and the upper packages 200 and 202 that are relatively thick are connected to each other in a PoP manner may be minimized. In addition, even when warpage has occurred in the SSD package 1014, force may not be directly applied to the first and second non-volatile memory packages 200 and 202 that are spaced apart from each other.

In other examples of the SSD package 1014, the non-volatile semiconductor memory chip 220 may be replaced with the non-volatile semiconductor memory chips 220-1 of FIG. 2, the lower mold layer 150 may not be formed as shown in FIG. 3, the controller chip 120a of FIG. 7 may be formed instead of the controller chip 120 and the semiconductor memory chip 130, or the fourth individual electronic component 180 of FIG. 9 may be further formed. Alternatively, the SSD package 1014 may include the controller chip 120b shown in FIG. 11 and the semiconductor memory chip 130b stacked on the controller chip 120b, instead of the controller chip 120 and the semiconductor memory chip 130.

Figure 22:
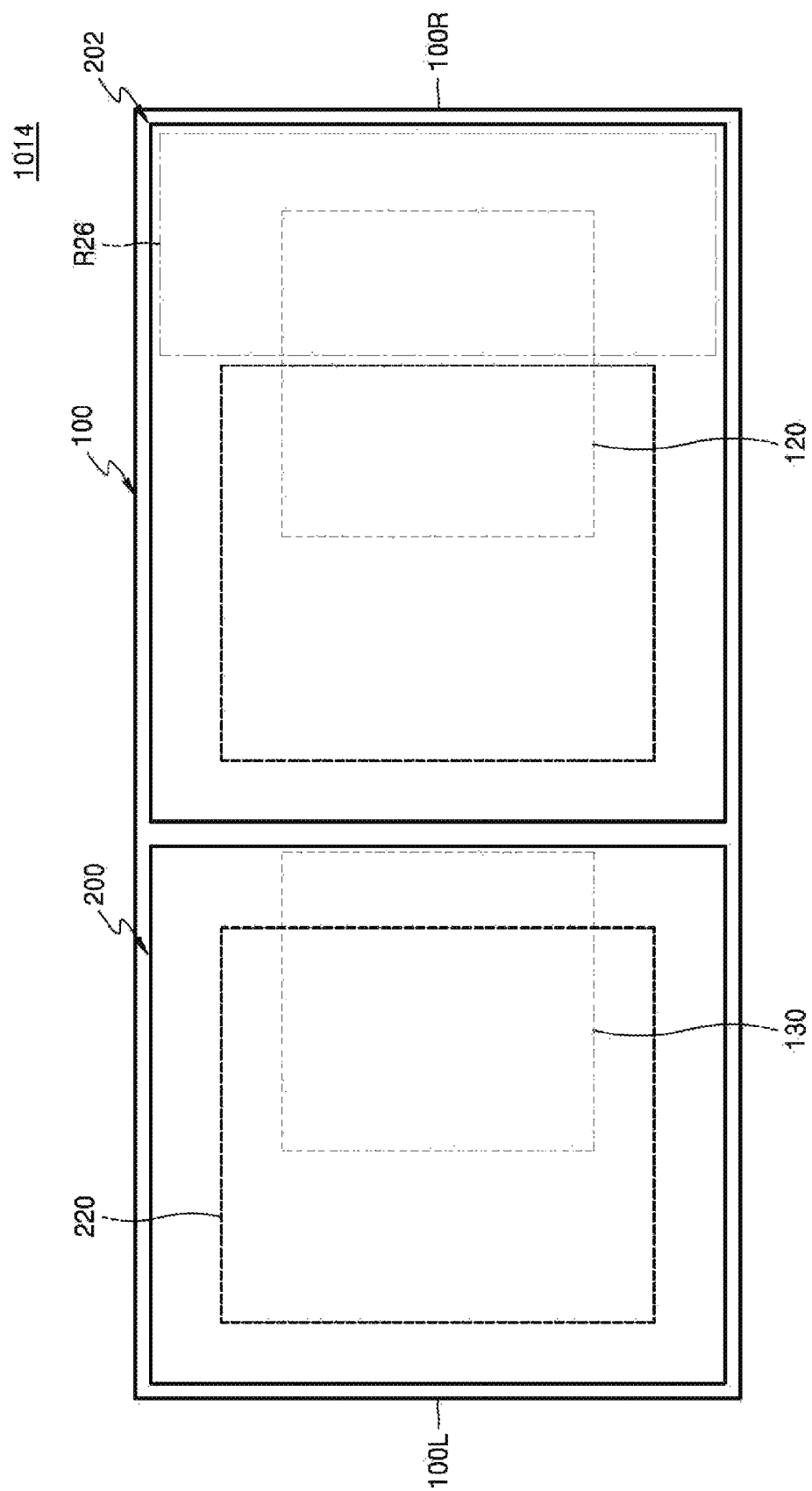
FIG. 22 is a plan of an arrangement of an main elements of an example of an SSD package according to the inventive concept.

FIG. 22 is a plan view showing an arrangement of the main elements in the SSD package 1014. In particular, FIG. 22 shows the arrangement of the main elements in the SSD package 1014 of FIG. 21.

Referring to FIG. 22, the SSD package 1014 includes the lower package 100, and the first non-volatile memory package 200 and the second non-volatile memory package 202 disposed on the lower package 100 as connected to the lower package 100 in a PoP manner.

The second non-volatile memory package 202 may further include the fifth individual electronic component 260 (see FIG. 21). The fifth individual electronic component 260 may be disposed on a second mounting region R26 that is spaced apart from the non-volatile semiconductor memory chip 220 in the second non-volatile memory package 202. The second mounting region R26 may be closer to the second edge 100R than to the first edge 100L of the lower package 100. The second mounting region R26 may be disposed on the lower package 100 so as to overlap the controller chip 120 of the lower package 100.

Figure 23:
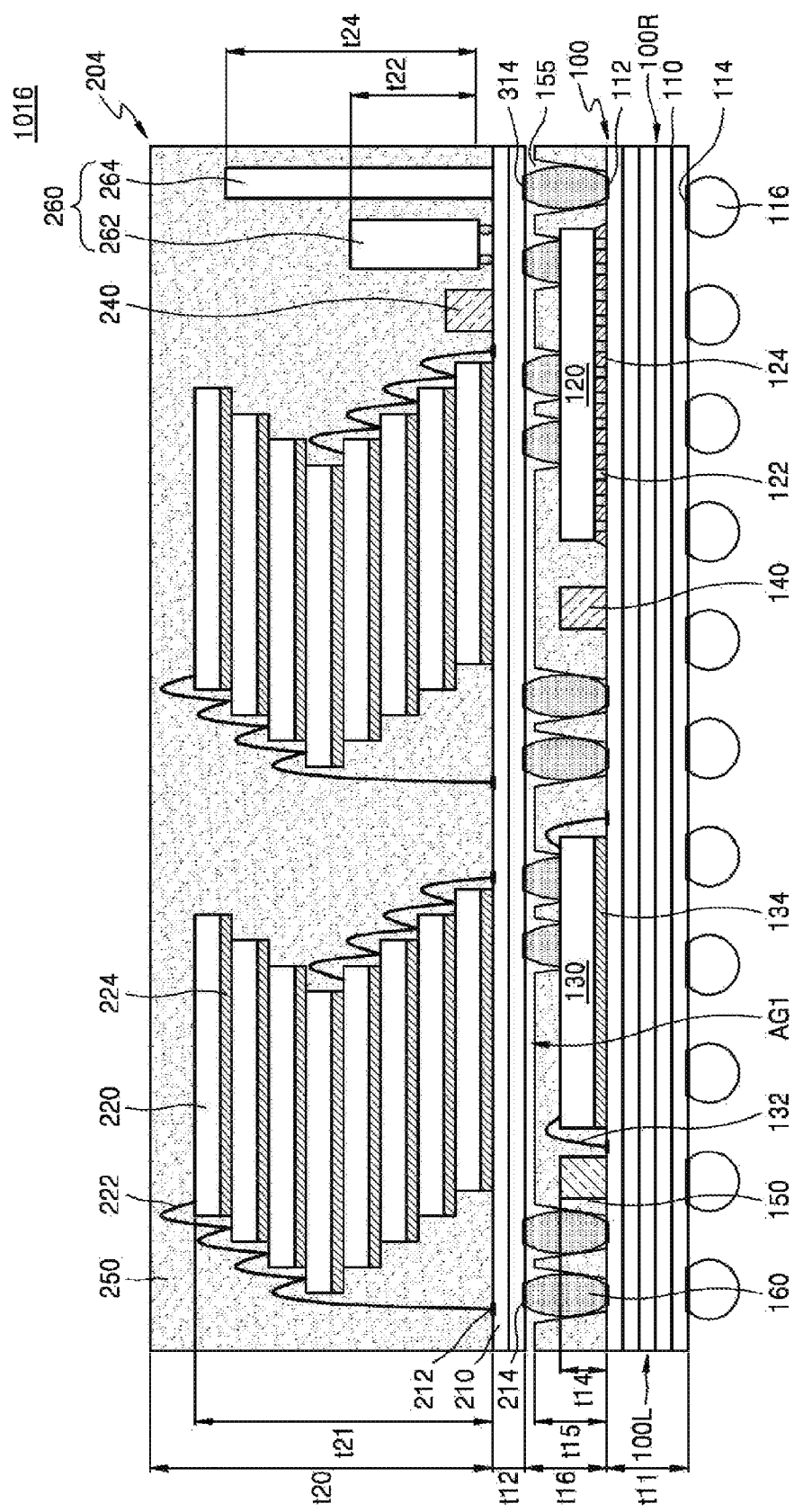
FIG. 23 is a cross-sectional view of an example of an SSD package according to the inventive concept.

FIG. 23 is a cross-sectional view of another example of an SSD package 1016 according to the inventive concept.

Referring to FIG. 23, the SSD package 1016 includes the lower package 100 and an upper package 204 disposed on the lower package 100 as connected to the lower package 100 in a PoP manner. The upper package 204 includes two or more stack structures, each including a plurality of non-volatile semiconductor memory chips 220 that are stacked. The upper package 204 may further include the sixth individual electronic component 260. The upper package 204 may be disposed on the lower package 100 so that the sixth individual electronic component 260 overlaps the controller chip 120 of the lower package 100.

Therefore, in the SSD package 1016, at least a part of the controller chip 120 may overlap the sixth individual electronic component 260, and thus, characteristic degradation caused by the heat generated from the controller chip 120 may be minimized.

The upper package 204 may be mounted on the lower package 100 so that the sixth individual electronic component 260 may be closer to the second edge 100R than to the first edge 100L.

In other examples of the SSD package 1016, the non-volatile semiconductor memory chip 220 may be replaced with the non-volatile semiconductor memory chips 220-1 of FIG. 2, the lower mold layer 150 may not be formed as shown in FIG. 3, the controller chip 120a of FIG. 7 may be used instead of the controller chip 120 and the semiconductor memory chip 130, or the fourth individual electronic component 180 of FIG. 9 may be further included. Alternatively, the SSD package 1016 may include the controller chip 120b and the semiconductor memory chip 130b stacked on the controller chip 120b shown in FIG. 11, instead of the controller chip 120 and the semiconductor memory chip 130.

Figure 24:
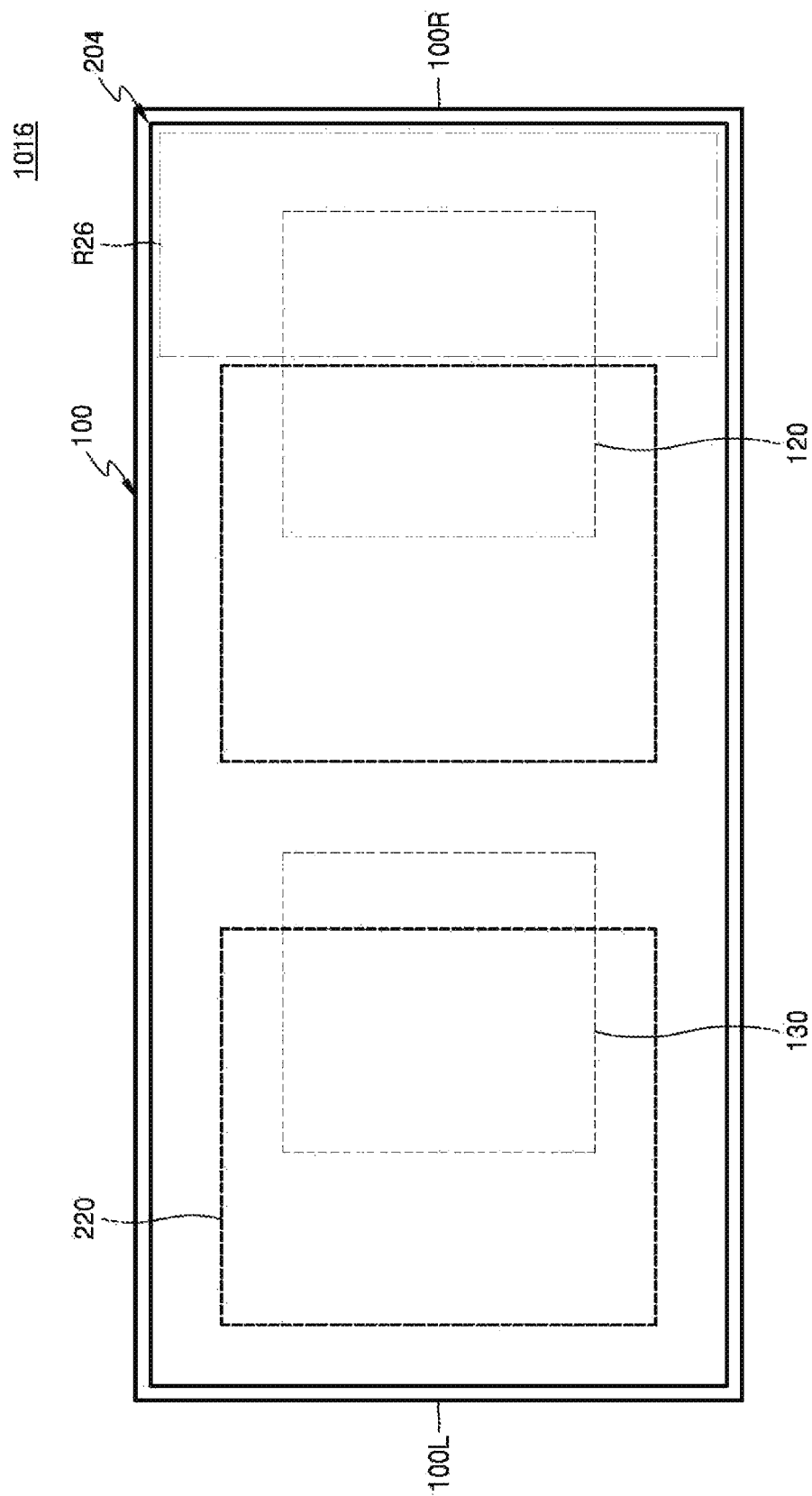
FIG. 24 is a plan view of an arrangement of main elements of an example of an SSD package according to the inventive concept.

FIG. 24 is a plan view of an arrangement of main elements in the SSD package 1016 according to the inventive concept. In particular, FIG. 24 shows arrangements of the main elements of the SSD package 1016 shown in FIG. 23.

Referring to FIG. 24, the SSD package 1016 includes the lower package 100 and the upper package 204 disposed on the lower package 100 as connected to the lower package 100 in a PoP manner.

The upper package 204 may further include the fifth individual electronic component 260 (see FIG. 23). The fifth individual electronic component 260 may be disposed on the second mounting region R26 that is spaced apart from the non-volatile semiconductor memory chip 220 in the upper package 204. The second mounting region R26 may be closer to the second edge 100R than to the first edge 100L of the lower package 100. The second mounting region R26 may be disposed on the lower package 100 so as to overlap the controller chip 120 of the lower package 100.

FIGS. 25 to 30 are cross-sectional views illustrating an example of a method of manufacturing an SSD package, according to the inventive concept.

Figure 25:
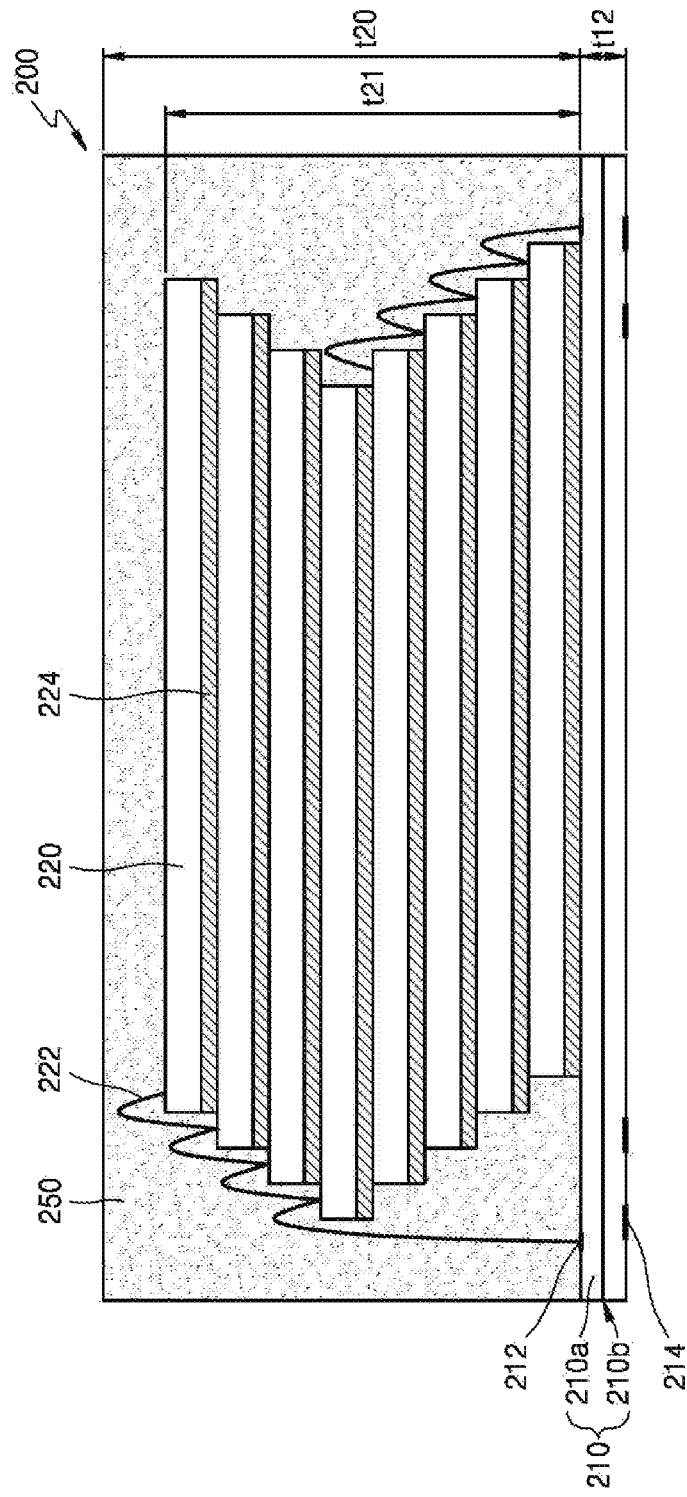
FIGS. 25, 26, 27, 27, 29 and 30 are cross-sectional views of an SSD package during the course of its manufacture and together illustrate an example of a method of manufacturing according to the inventive concept.
Figure 26:
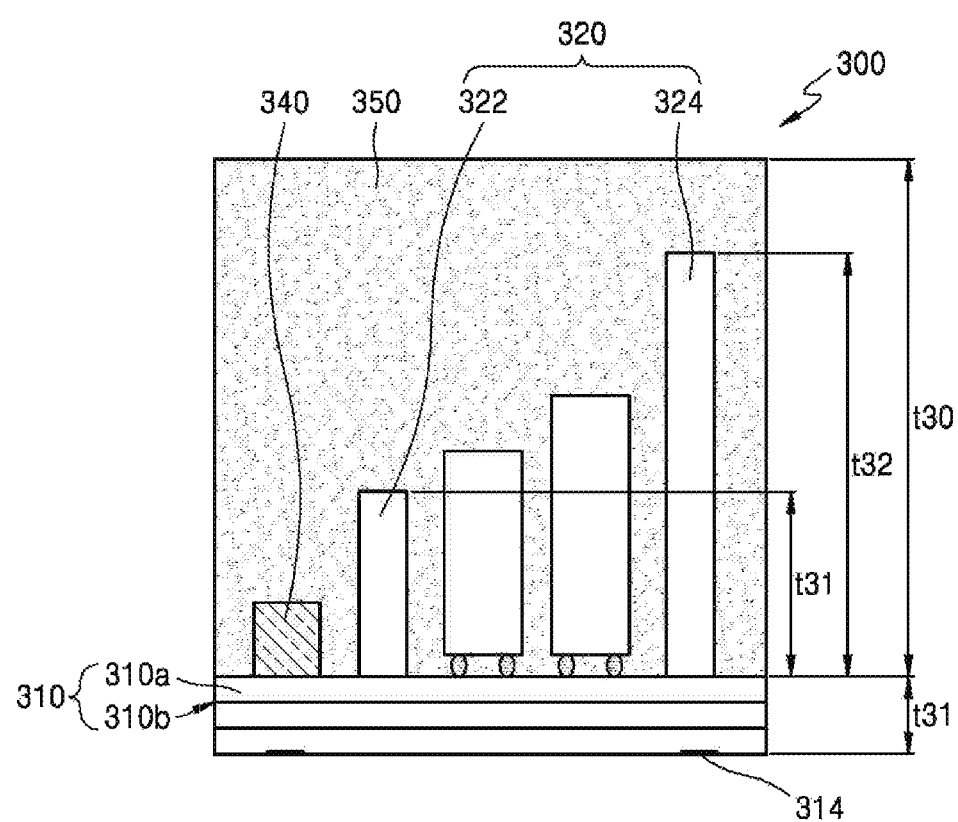
Figure 27:
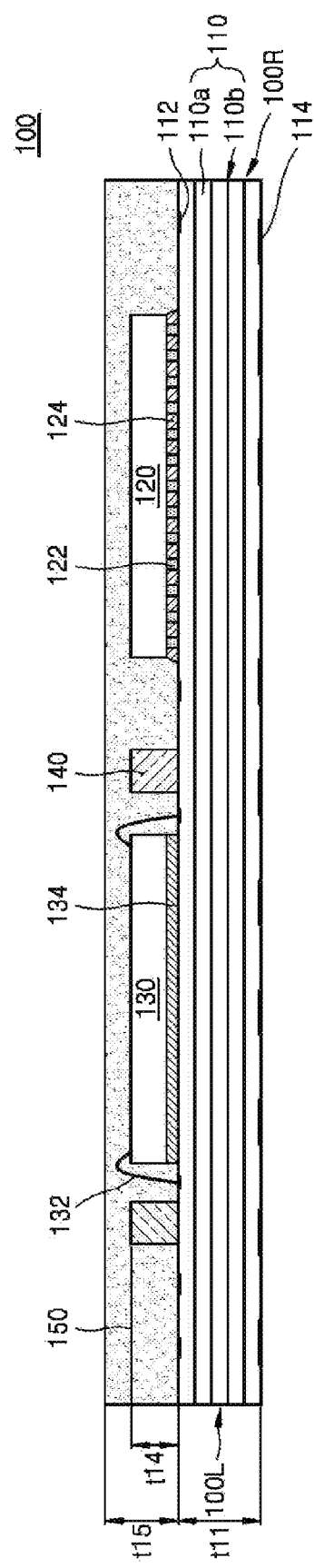

Referring to FIGS. 25 to 27, the lower package 100 and the (first and second?) upper packages 200 and 300 are prepared.

The lower package 100, the first upper package 200, and the second upper package 300 may be respectively manufactured by package assembling processes. Therefore, the lower package 100, the first upper package 200, and the second upper package 300 may be manufactured respectively, and checked for defects. Therefore, manufacturing yield of the SSD package may be improved.

In addition, the first upper package 200 may include the non-volatile semiconductor memory chip 220, and the second upper package 300 may include a second individual electronic component 320. In some examples, the second upper package 300 may further include a third individual electronic component 340. Therefore, the first upper package 200, that is, the non-volatile semiconductor memory chip 200, and the second upper package 300 including the second individual electronic component 320 are separately manufactured, and accordingly, manufacturing yield of each of the first and second upper packages 200 and 300 may be improved.

The lower package substrate 110, the first upper package substrate 210, and the second upper package substrate 310 may respectively include substrate bases respectively including a plurality of base layers 110a, 210a, and 310a, and layers 110b, 210b, and 310b formed respectively between an upper surface, a lower surface, and the plurality of base layers 110a, 210a, and 310a to have circuit wires. That is, the lower package substrate 110, the first upper package substrate 210, and the second upper package substrate 310 may each include a plurality of layers.

The second upper package 300 may need relatively more circuit wires than the first upper package 200, that is, the non-volatile memory package 200. Therefore, the number of layers of the second upper package substrate 310 may be greater than that of the layers of the first upper package substrate 210. In addition, because the lower package 100 includes the controller chip 120, the lower package substrate 110 may need relatively more circuit wires than the first and second upper package substrates 210 and 310. Therefore, the number of layers of the second upper package substrate 310 may be less than that of the layers of the lower package substrate 110 and may be greater than that of the layers of the first upper package substrate 210.

For example, the lower package substrate 110 may include six layers 110b, the first upper package substrate 210 may include three layers 210b, and the second upper package substrate 310 may include four layers 310b, but the inventive concept is not limited thereto.

Figure 28:
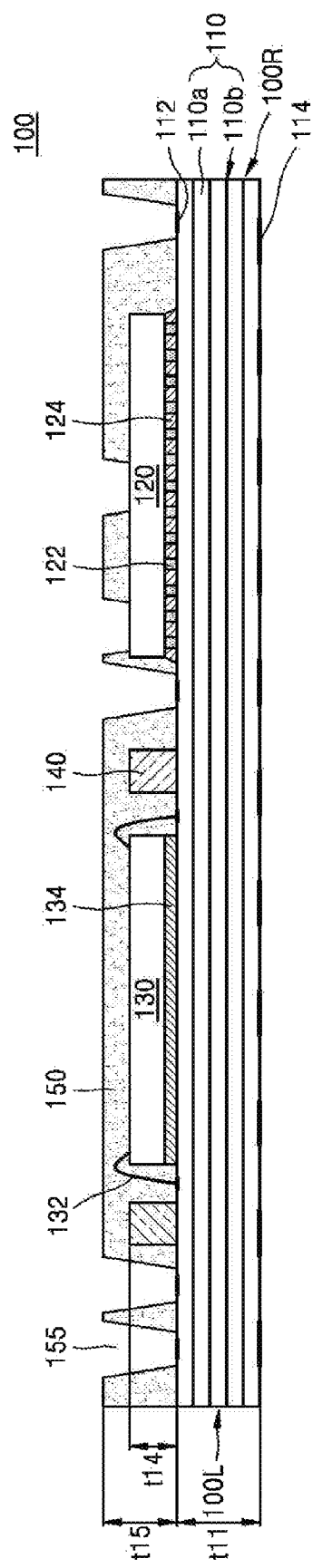

Referring to FIG. 28, through holes 155 penetrating through the lower mold layer 150 to expose some parts on the upper surface of the lower package substrate 110 are formed. The through holes 155 are formed at locations corresponding to the upper pads 112 of the lower package substrate 110, so that the upper pads 112 of the lower package substrate 110 may be exposed through the through holes 155. The through holes 155 may be formed by, for example, a laser drilling method.

Figure 29:
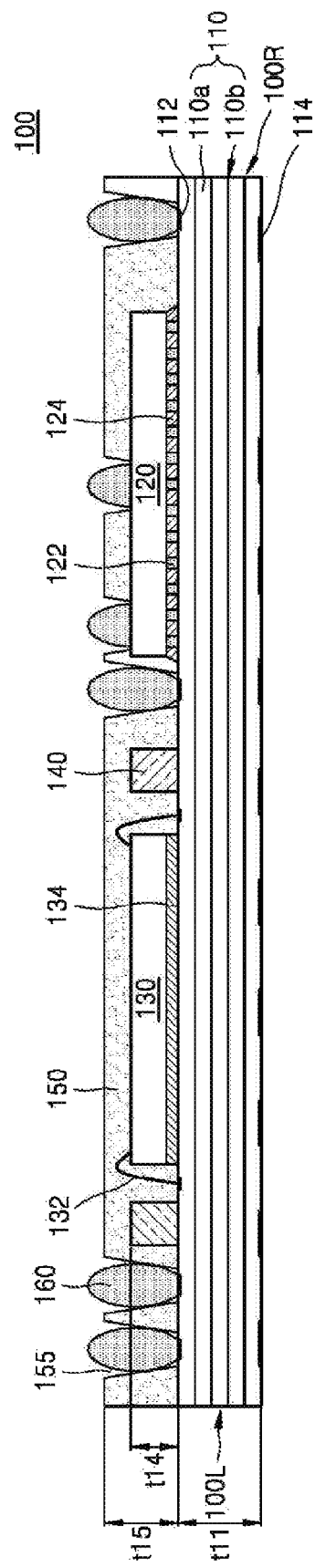
Figure 30:
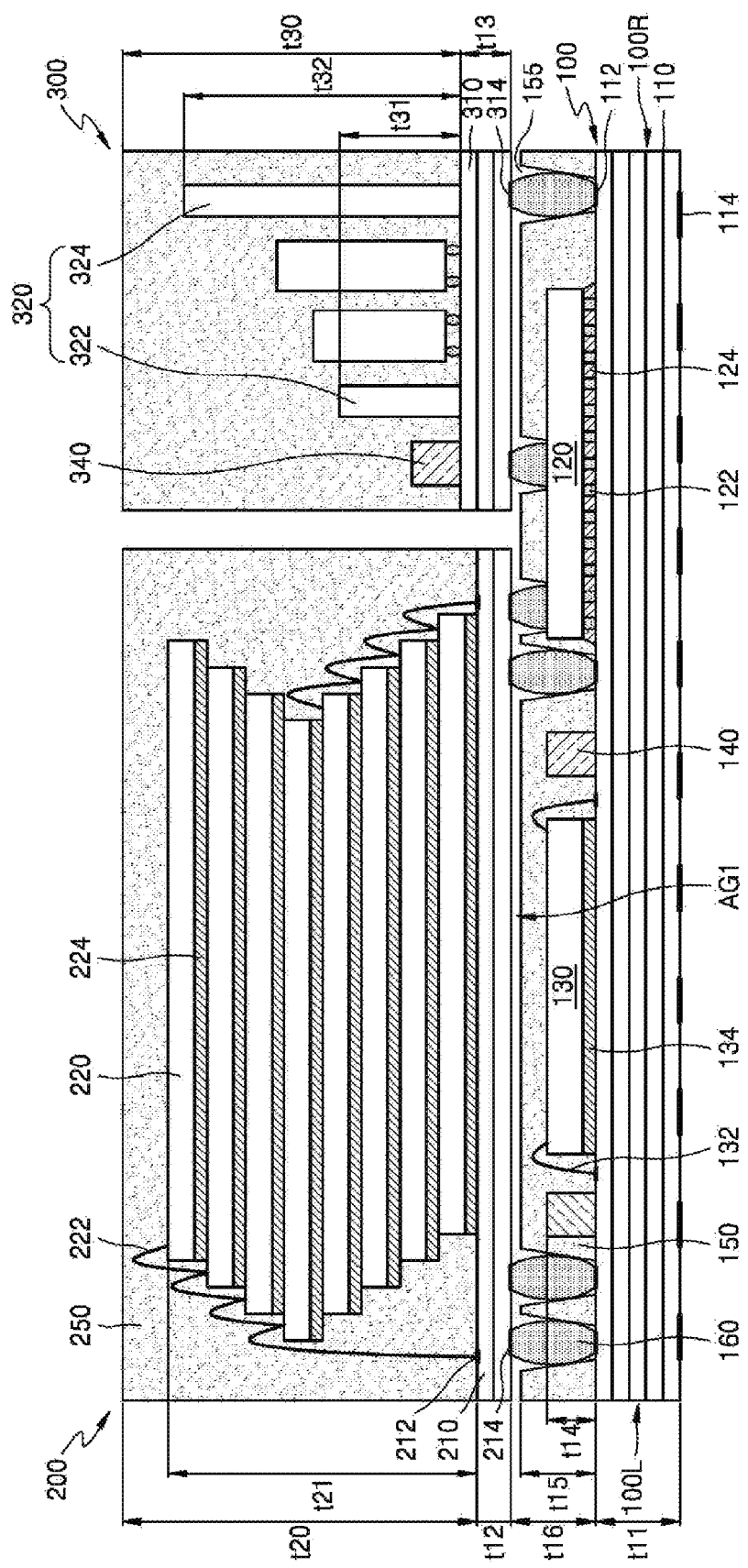

Referring to FIGS. 29 and 30, the first and second upper packages 200 and 300 and the lower package 100 may be electrically connected to each other via the conductive connection members 160 disposed through the through holes 155. In more detail, the first and second upper package substrates 210 and 310 of the first and second upper packages 200 and 300 and the lower package substrate 110 of the lower package 100 may be connected via the conductive connection members 160. In FIG. 29, the conductive connection members 160 are attached to the upper pads 112 of the lower package substrate 110 via the through holes 155, and then, the conductive connection members 160 are attached to the lower pads 214 and 314 of the first and second upper package substrates 210 and 310, but are not limited thereto. For example, the conductive connection members 160 are attached to the lower pads 214 and 314 of the first and second upper package substrates 210 and 310, and after that, the conductive connection members 160 may be attached to the upper pads 112 of the lower package substrate 110.

After that, as shown in FIG. 1, external connection members 116 are attached to the lower pads 114 of the lower package substrate 110 to finish manufacturing of the SSD package 1000.

Note, the SSD packages 1000a, 1000b, 1002, 1004, 1006, 1008, 1010, 1012, 1014, and 1016 shown in and described with reference to FIGS. 2 to 24 may be manufactured in a manner similar to that shown in and described FIGS. 25 to 30.

Figure 31:
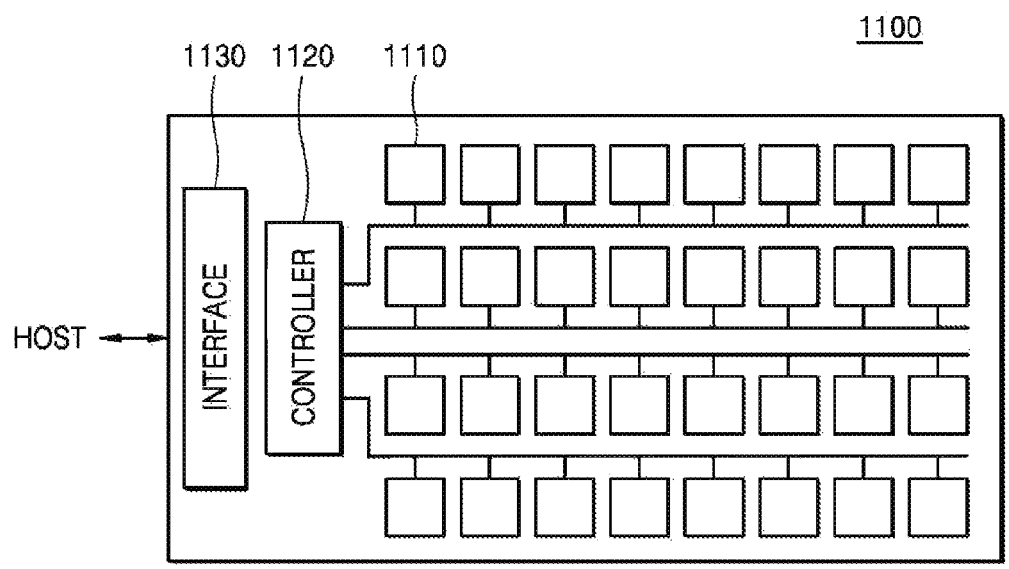
FIG. 31 is a block diagram of an SSD package according to the inventive concept.

FIG. 31 is a block diagram of an SSD package 1100 according to the inventive concept.

Referring to FIG. 31, the SSD package 1100 includes a plurality of non-volatile memories 1110 and a controller 1120. The non-volatile memories 1110 may store data, and maintain data stored therein even when supply of an electric power is terminated. The non-volatile memory 1110 may be one of the non-volatile semiconductor memory chips shown in and described with reference to with reference to FIGS. 1 to 30.

The controller 1120 may read data stored in the non-volatile memories 1110 or store data in the non-volatile memories 1110, in response to read/write requests of a host HOST. An interface 1130 may transmit or receive commands and address signals to/from the host HOST, and then, may transmit or receive the commands and the address signals to/from the non-volatile memories 1110 via the controller 1120. The controller 1120 and the interface 1130 may be respectively one of the controller chips shown in and described with reference to with reference to FIGS. 1 to 30.

The SSD package 1110 may further include an active device or a passive device such as a resistor, a capacitor, an inductor, a switch, a sensor, a DC-DC converter, quartz for generating clock signals, or a voltage regulator.

Figure 32:
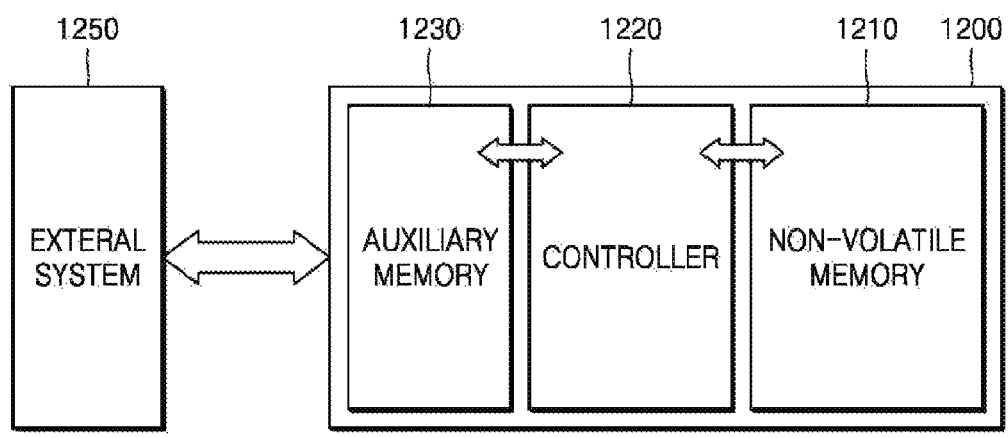
FIG. 32 is a schematic diagram showing a relationship between an SSD package according to the inventive concept and an external system.

FIG. 32 is a schematic diagram showing a relation between an SSD package according to the inventive concept and an external system 1250.

Referring to FIG. 32, data input from the external system 1250 may be stored in a non-volatile memory 1210 via an auxiliary memory 1230 and a controller 1220. In addition, the controller 1220 may read data from the non-volatile memory 1210 via the auxiliary memory 1230 and transmit the data to the external system 1250.

The non-volatile memory 1210 may be one of the non-volatile semiconductor memory chips shown in and described with reference to with reference to FIGS. 1 to 30. The controller 1220 may be one of the controller chips shown in and described with reference to FIGS. 1 to 30. The auxiliary memory 1230 may be one of the semiconductor memory chips shown in and described with reference to FIGS. 1 to 30 or may be a part of the controller chip 120a shown in and described with reference to with reference to FIG. 7.

Figure 33:
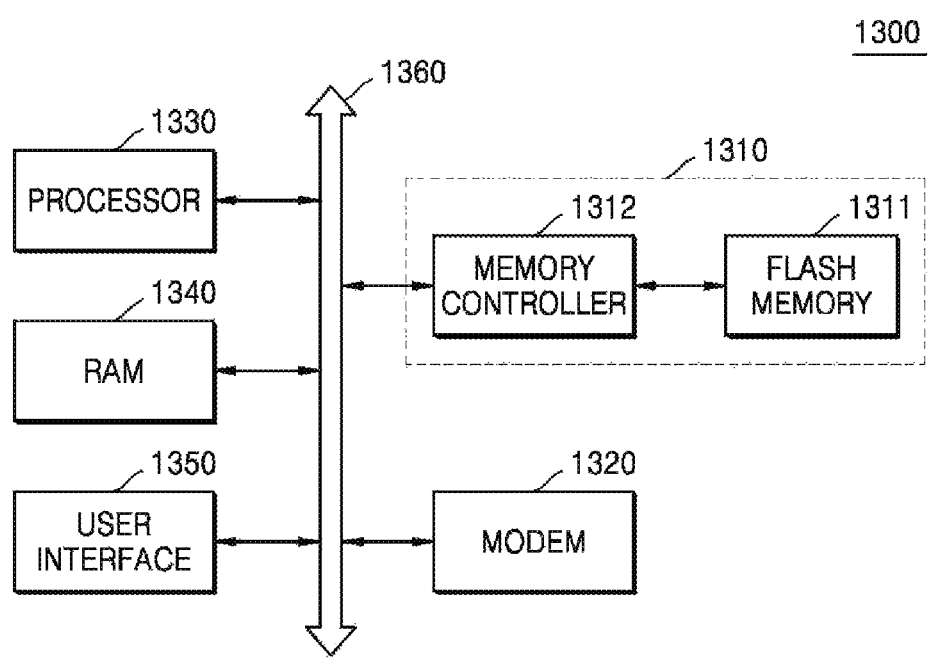
FIG. 33 is a block diagram of a data storage system according to the inventive concept.

FIG. 33 is a block diagram of a data storage system 1300 according to the inventive concept.

Referring to FIG. 33, the data storage system 1300 may include a processor 1330 such as a central processing unit (CPU), a random access memory (RAM) 1340, a user interface 1350, and a modem 1320 communicating with each other via a common bus 1360. Each of the above devices transmits a signal to a storage device 1310 and receives a signal from the storage device 1310 via the common bus 1360. The storage device 1310 may include a flash memory 1311 and a memory controller 1312. The flash memory 1310 may store data, and has a non-volatile property, that is, maintains data stored therein even when supply of the electric power is terminated. The storage device 1310 may be one of the SSD packages shown in and described with reference to with reference to FIGS. 1 to 30.

Figure 34:
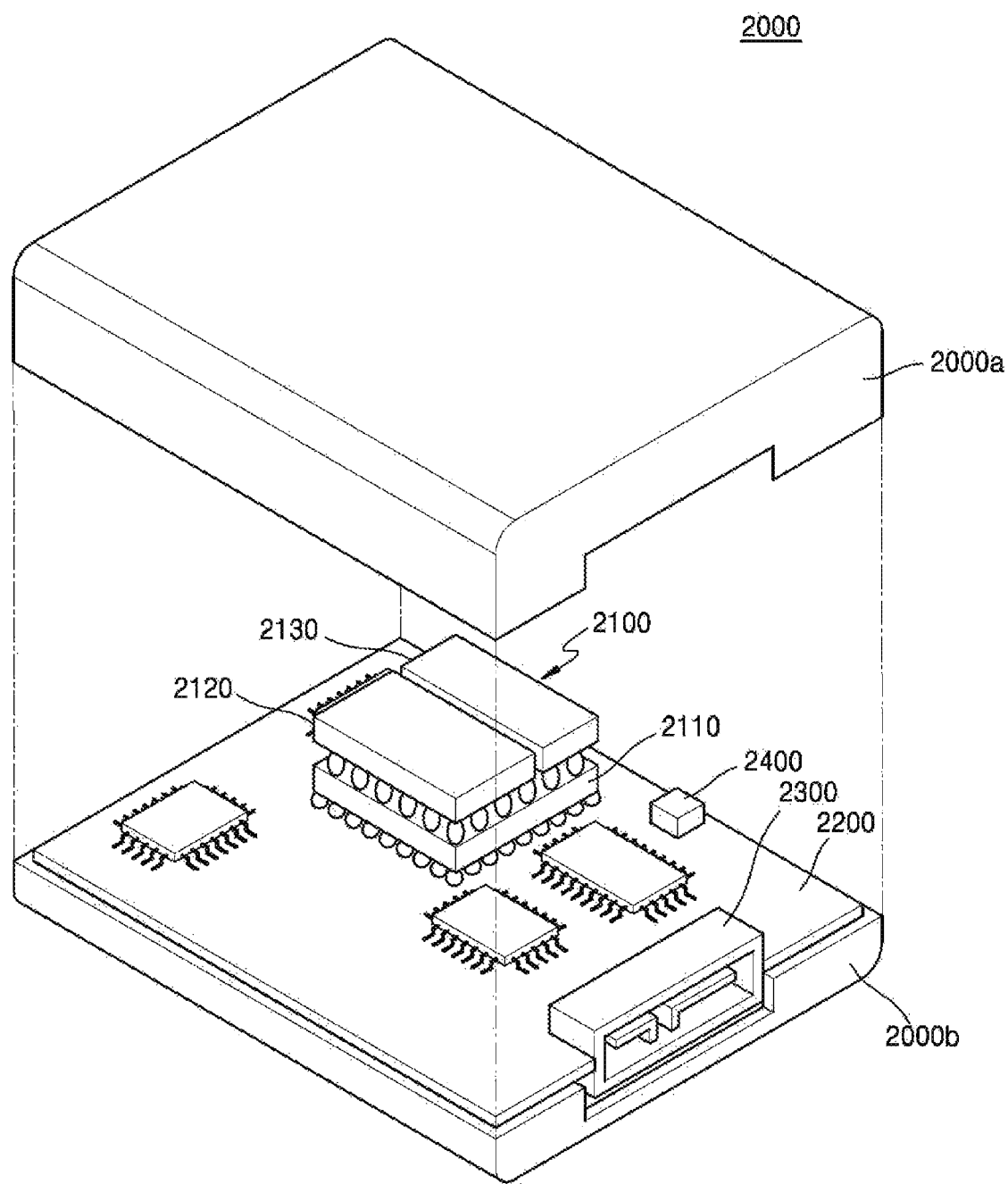
FIG. 34 is an exploded perspective view of a data storage system according to the inventive concept.

FIG. 34 is an exploded perspective view of a data storage system 2000 according to the inventive concept.

Referring to FIG. 34, the data storage system 2000 includes a main board 2200 and an SSD package 2100 mounted on the main board 2200. The SSD package 2100 may be electrically connected to an input/output terminal 2300 via wires formed on the main board 2200. The SSD package 2100 includes a lower package 2110 and upper packages 2120 and 2130 mounted on the lower package 2110. The SSD package 2100 may be one of the SSD packages shown in and described with reference to with reference to FIGS. 1 to 30.

In addition, the data storage system 2000 may further include a power terminal 2400 for supplying electric power to the main board 2200. The main board 2200 may be provided in cases 2000a and 2000b.

The input/output terminal 2300 may configure an interface between the data storage system 2000 and an external device. The input/output terminal 2300 may include a program capable of transmitting/receiving signals to/from an external device in a manner according to a standard protocol such as PCIe, SAS, or SATA. Here, SATA may include all SATA-based standards such as SATA-2, SATA-3, e-SATA (external SATA), etc., as well as SATA-1.

The data storage system 2000 may be a portable data storage system, a network attached storage (NAS), for example. Here, the NAS may be a device inputting/outputting data via a local area network (LAN) such as Ethernet or TCP/IP, or a wide area network (WAN). Here, the input/output terminal 2300 may be a terminal capable of accommodating an input/output cable according to network standard.

Figure 35:
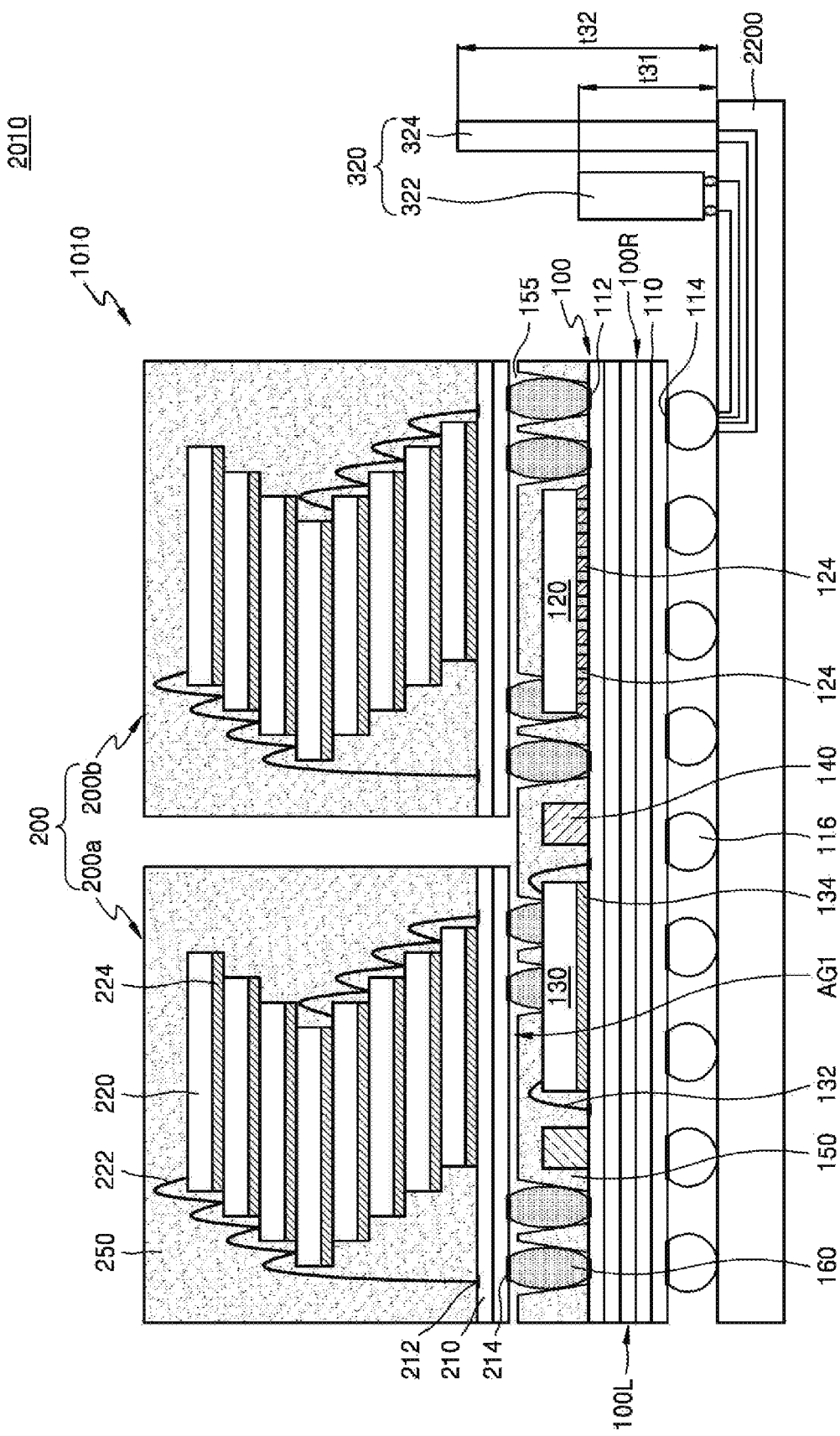
FIG. 35 is a cross-sectional view of a data storage system according to the inventive concept.

FIG. 35 is a cross-sectional view of a data storage system 2010 according to the inventive concept.

Referring to FIG. 35, the data storage system 2010 includes the main board 2200 and the SSD package 1010 mounted on the main board 2200. The SSD package 1010 may be electrically connected to the wires formed on the main board 2200 via external connection members 116. The SSD package 1010 is described above with reference to FIG. 17, and thus, detailed descriptions thereof are omitted here.

The data storage system 2010 is attached onto the main board 2200, and includes the second individual electronic component 320 used to drive the SSD package 1010. The second individual electronic component 320 may be an active device or a passive device such as an inductor, a switch, a sensor, a DC-DC converter, quartz for generating clock signals, and a voltage regulator. Thickness t31 and t32 of the second individual electronic component 320 may be greater than the thickness of the lower mold layer 150 of the SSD package 1010. The second individual electronic component 320 is connected to the SSD package 1010 via the wires formed on the main board 2200 to be used to drive the SSD package 1010.

In the data storage system 2010, since the second individual electronic component 320 that is relatively large in thickness is not mounted on the SSD package 1010, the total thickness of the SSD package 1010 may not increase. Accordingly, a volume of the data storage system 2010 may be reduced.

Figure 36:
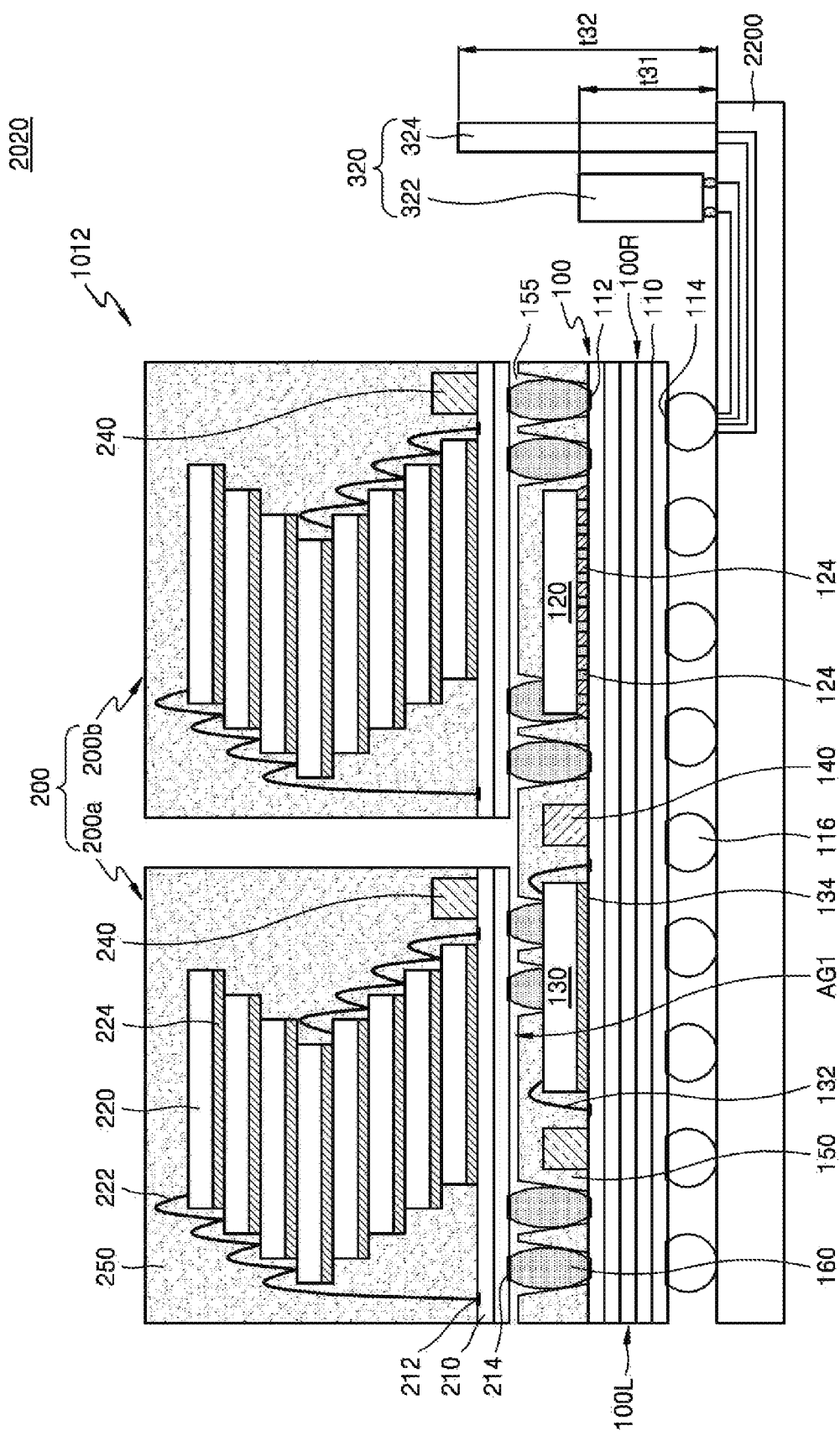
FIG. 36 is a cross-sectional view of a data storage system according to the inventive concept.

FIG. 36 is a cross-sectional view of a data storage system 2020 according to the inventive concept.

Referring to FIG. 36, the data storage system 2020 includes the main board 2200 and the SSD package 1012 mounted on the main board 2200. The SSD package 1012 may be electrically connected to wires formed on the main board 2200 via external connection members 116. Since the SSD package 1012 has been described above with reference to FIG. 18, descriptions thereof are omitted here.

The data storage system 2020 includes the second individual electronic component 320 attached onto the main board 2200 and used to drive the SSD package 1012. The thickness t31 and t32 of the second individual electronic component 320 may be greater than the thickness of the lower mold layer 150 of the SSD package 1012. The second individual electronic component 320 is connected to the SSD package 1012 via the wires formed on the main board 220 to be used to drive the SSD package 1012.

In the data storage system 2020, the second individual electronic component 320 having the relatively large thickness is not mounted on the SSD package 1012, and thus, the total thickness of the SSD package 1012 may be kept to a minimum. In addition, the volume of the data storage system 2020 may be minimal.

Figure 37:
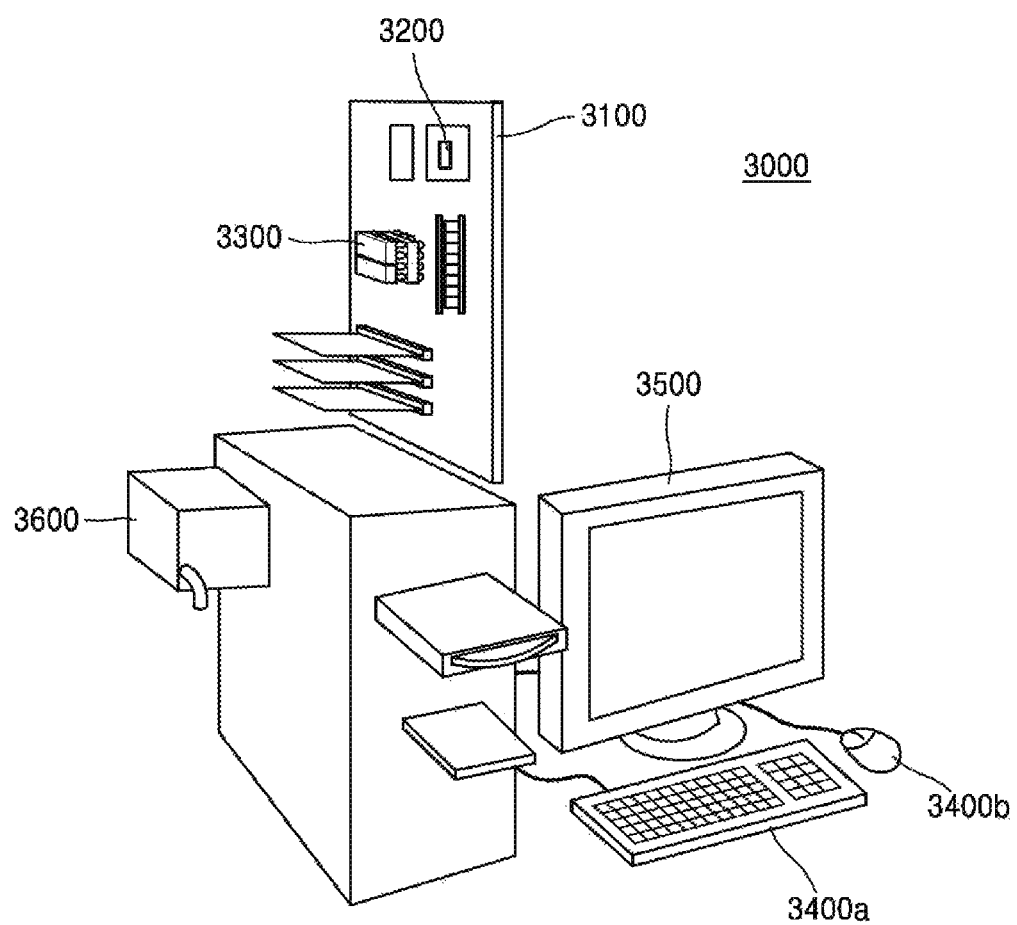
FIG. 37 is a conceptual diagram of a computer system according to the inventive concept.

FIG. 37 is a conceptual view of a computing system 3000 according to the inventive concept.

Referring to FIG. 37, the system 3000 includes a main board 3100, a CPU 3200 mounted on the main board 3100, an SSD package 3300, input devices 3400a and 3400b, and an output device 3500. The SSD package 3300 may be one of the SSD packages shown in and described with reference to FIGS. 1 to 30.

The input devices 3400a and 3400b may be respectively a keyboard, a mouse, a touch screen, etc., but are not limited thereto. The input devices 3400a and 3400b may be devices for inputting data to the CPU 3200. The output device 3500 may be a monitor, a printer, etc., but is not limited thereto. The output device 3500 may be a device for outputting data from the CPU 3200. The input devices 3400a and 3400b and the output device 3500 may be integrated as an apparatus.

The SSD package 3300 may be mounted on the main board 3100. The SSD package 3300 may communicate with the CPU 3200 in a manner according to the standard protocol via conductive patterns formed on the main board 3100.

The system 3000 may include a power supply apparatus 3600 to supply an electric power to the main board 3100.

The system 3000 is shown in the form of a desk top personal computer, but the features described in connection therewith may be applied to a laptop personal computer, a smartphone, a tablet computer, a portable multimedia player (PMP), a navigation system, and a flat display television according to the inventive concept.

Figure 38:
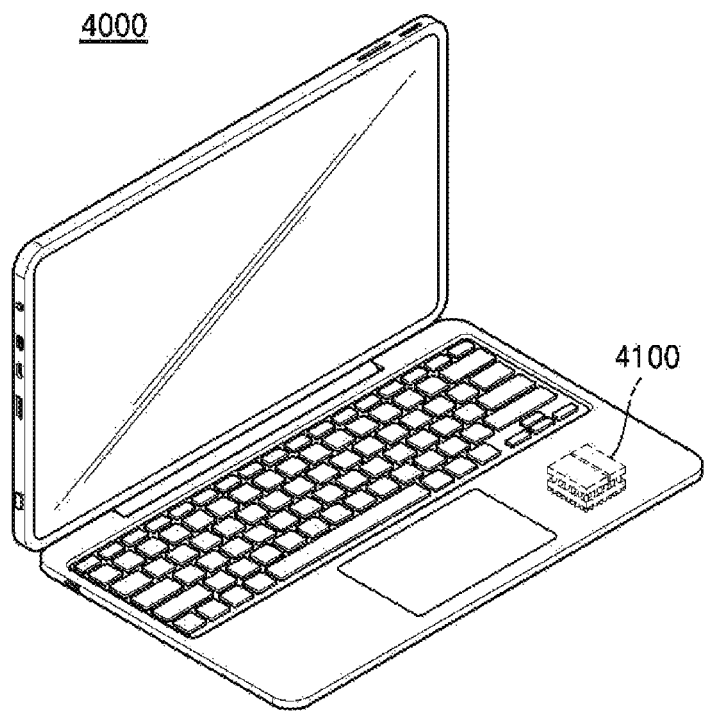
FIGS. 38 and 39 are perspective views of examples of multimedia devices according to the inventive concept.
Figure 39:
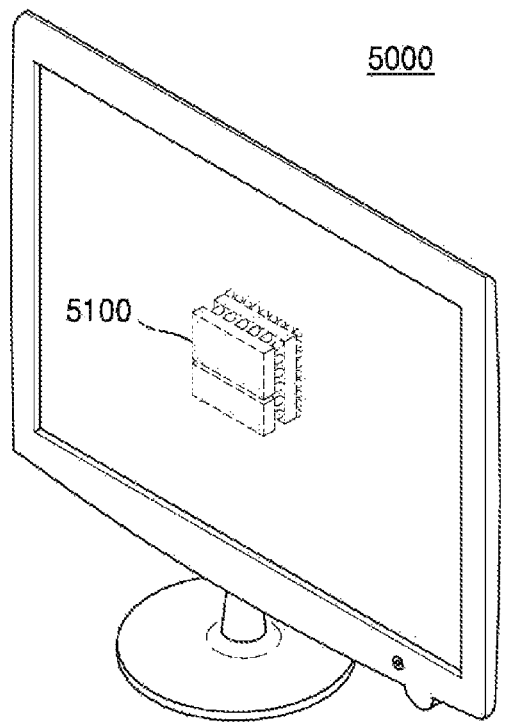

FIGS. 38 and 39 are perspective views showing examples of multimedia devices according to the inventive concept.

Referring to FIGS. 38 and 39, the semiconductor package according to the inventive concept may be employed by various multimedia devices. For example, an SSD package 4010 according to the inventive concept may be employed by a laptop computer 4000 as shown in FIG. 38. In addition, an SSD package 5010 according to the inventive concept may be employed by a television or a smart television 5000 as shown in FIG. 39.

The laptop computer 4000 and the television or the smart television 5000 adopt the SSD package that is highly reliable, has high capacity with respect to a unit volume, or has a small size with respect to a unit capacity, and thus, the laptop computer 4000 and the television or the smart television 5000 are highly reliable while be compact and offering high performance.

Although the inventive concept has been particularly shown and described with reference to various examples thereof, it will be understood that various changes in form and details may be made to such examples without departing from the spirit and scope of the inventive concept as defined by the following claims.

What is claimed is:

1. A solid state drive (SSD) package-on-package (PoP), comprising:
   a lower package comprising a lower package substrate, a controller chip disposed on and mounted to the lower package substrate, and a lower mold layer on an upper surface of the lower package substrate and covering the controller chip;
   a plurality of upper packages disposed on the lower package as spaced laterally apart from each other, and including a non-volatile memory package comprising a non-volatile memory and an individual component package comprising an individual electronic component, the non-volatile memory and the individual electronic component being electrically connected to the lower package, and each of the upper packages comprising an upper package substrate and an upper mold layer on the upper package substrate; and
   conductive connection members that electrically connect the lower package substrate to the upper package substrate of each of the upper packages,
   wherein the height of the individual electronic component is greater than a thickness of the lower mold layer at the controller chip as measured from the upper surface of the lower package substrate,
   the lower package substrate and the upper package substrate of each of the upper packages respectively comprise multi-layered printed circuit boards, and
   the number of layers of the multi-layered printed circuit board of the lower package substrate is greater than the number of layers of the multi-layered printed circuit board of each of the upper package substrates, and
   the number of layers of the multi-layered printed circuit board of the individual electronic component package is greater than the number of layers of the multi-layered printed circuit board of the non-volatile memory package.

2. The SSD package-on-package of claim 1, wherein the lower package further comprises a semiconductor memory chip mounted on the lower package substrate as laterally spaced apart from the controller chip, and the non-volatile memory package spans the semiconductor memory chip as viewed in plan.

3. The SSD package-on-package of claim 2, wherein the semiconductor memory chip comprises a non-volatile memory.

4. The SSD package-on-package of claim 1, wherein the individual electronic component package overlaps the controller chip as viewed in plan.

5. The SSD package-on-package of claim 1, wherein the lower mold layer has through holes leading to parts of the lower package substrate, respectively, and the conductive connection members are disposed in the through holes so as to be connected to the parts of the lower package substrate to which the through holes lead.

6. The SSD package-on-package of claim 1, further comprising at least one second individual electronic component mounted to the lower package substrate and spaced apart from the plurality of upper packages, and
wherein the height of the at least one second individual electronic component is greater than the thickness of the lower mold layer.

7. The SSD package-on-package of claim 1, wherein height of each of the conductive connection members is greater than the thickness of the lower mold layer.

8. The SSD package-on-package of claim 1, wherein the thickness of the lower package substrate is greater than the thickness of the upper package substrate of each of the upper packages.

9. The SSD package-on-package of claim 1, wherein the thickness of each of the plurality of upper packages is greater than the thickness of the lower package.

10. The SSD package-on-package of claim 1, wherein the non-volatile memory package comprises a stack of semiconductor memory chips each comprising a non-volatile memory.

11. The SSD package-on-package of claim 1, wherein the individual electronic component is one of a resistor, a capacitor, an inductor, a switch, a sensor, a DC-DC converter, a component comprising a quartz crystal, and a voltage regulator.

12. A solid state drive (SSD) package-on-package (PoP), comprising:
a lower package comprising a lower package substrate, and a semiconductor memory chip and a controller chip mounted to the lower package substrate, wherein the lower package substrate has a first side and a second side facing in directions opposite to each other, and the semiconductor memory chip and the controller chip are disposed on the lower package substrate respectively adjacent the first side and the second side of the lower package substrate as viewed in a plan view of the PoP; and
a plurality of upper packages disposed on the lower package as spaced laterally apart from each other, and electrically connected to the lower package,
wherein the plurality of upper packages includes a first upper package comprising a non-volatile semiconductor memory chip and a second upper package comprising a first individual electronic component, wherein the first upper package and the second upper package are disposed adjacent the first side and the second side of the lower package substrate, respectively, as viewed in the plan view of the PoP,
the first upper package and the second upper package respectively include a first upper package substrate to which the non-volatile semiconductor memory chip is mounted and a second upper package substrate to which the first individual electronic component is mounted,
the first upper package substrate and the second upper package substrate have upper surfaces on which the semiconductor memory chip and the first individual electronic component are disposed, respectively, and lower surfaces facing the lower package,
the lower package substrate, the first upper package substrate, and the second upper package substrate respectively comprise printed circuit boards,
each of the printed circuit boards of at least the second upper package substrate and the lower package substrate is a multi-layer printed circuit board comprising a plurality of circuit board layers each consisting of a layer of insulating material and respective wiring integral with the layer of insulating material, and
the number of circuit board layers of the second upper package substrate is greater than the number of circuit board layers of the first upper package substrate and smaller than the number of circuit board layers of the lower package substrate.

13. The SSD package-on-package of claim 12, wherein the lower package has an upper surface on which the semiconductor memory chip and the controller chip are disposed, and the height of the first individual electronic component is equal to or greater than a distance between the upper surface of the lower package substrate and lower surfaces of the upper packages.

14. The SSD package-on-package of claim 12, wherein the lower package further comprises a second individual electronic component disposed on and mounted to the lower package substrate, and
the height of the second individual electronic component is greater than the thickness of each of the upper packages, and an uppermost end of the second individual electronic component is at a level that is equal to or lower than those of the upper surfaces of the upper packages.

15. The SSD package-on-package of claim 12, wherein the lower package further comprises a lower mold layer on an upper surface of the lower package substrate and covering the semiconductor memory chip and the controller chip, and an upper surface of the lower mold layer is at a level lower than that of each of the lower surfaces of the upper package substrates, and an air gap exists between the upper surface of the lower mold layer and the lower surfaces of the upper package substrates.

16. The SSD package-on-package of claim 12, wherein the first individual electronic component is one of a resistor, a capacitor, an inductor, a switch, a sensor, a DC-DC converter, a component comprising a quartz crystal, and a voltage regulator.

17. A solid state drive (SSD) package-on-package (PoP), comprising:
a lower package comprising a lower package substrate, and a controller chip disposed on an upper surface of and mounted to the lower package substrate; and
a plurality of upper packages disposed on and mounted to the lower package as spaced laterally apart from each other, each of the upper packages being electrically connected to the lower package, and
wherein each of the upper packages includes an upper package substrate, and the plurality of upper packages include an individual electronic component and at least one semiconductor memory chip comprising a non-volatile memory spaced laterally from the individual electronic component, the individual electronic component being disposed on an upper surface of and mounted to a respective one of the upper package substrates, and each said at least one semiconductor memory chip also being disposed on an upper surface of and mounted to a respective one of the upper package substrates, the upper package substrates have respective lower surfaces facing the lower package, the respective one of the upper package substrates to which the individual electronic component is mounted overlapping the controller chip as viewed in a plan view of the PoP, and the height of the individual electronic component is greater than each of the respective distances between the upper surface of the lower package substrate and the lower surfaces of the upper package substrates.

18. The SSD package-on-package of claim 17, wherein the upper packages include a semiconductor memory chip package and an individual electronic component package, the semiconductor memory chip package including a first one of the upper package substrates, and a stack of semiconductor memory chips disposed on and mounted to the first one of the upper package substrates, and the individual electronic component package including a second one of the upper package substrates, and a group of individual electronic components disposed on and mounted to the second one of the upper package substrates.

19. The SSD package-on-package of claim 18, further comprising a plurality of electrically conductive connection members extending between and electrically connecting the lower package substrate to the upper packages substrates, and wherein each of the package substrates is a respective multi-layered printed circuit board comprising circuit board layers of insulating material disposed one on another, and the number of circuit board layers of the second one of the upper package substrates is greater than the number of circuit board layers of the first one of the upper package substrates and smaller than the number of circuit board layers of the lower package substrate.

20. The SSD package-on-package of claim 17, wherein the individual electronic component is one of a resistor, a capacitor, an inductor, a switch, a sensor, a DC-DC converter, a component comprising a quartz crystal, and a voltage regulator.

* * * * *